United States Patent
Tsai et al.

(10) Patent No.: US 12,158,786 B2
(45) Date of Patent: Dec. 3, 2024

(54) COOLING APPARATUS

(71) Applicant: COOLER MASTER CO., LTD., Taipei (TW)

(72) Inventors: Shui Fa Tsai, Taipei (TW); Yuan Wu, Hui Zhou (CN); Wei Ju Lin, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 244 days.

(21) Appl. No.: 17/957,644

(22) Filed: Sep. 30, 2022

(65) Prior Publication Data
US 2023/0025258 A1    Jan. 26, 2023

Related U.S. Application Data

(63) Continuation-in-part of application No. 16/783,110, filed on Feb. 5, 2020, now Pat. No. 11,474,574, which (Continued)

(30) Foreign Application Priority Data

Jun. 15, 2022    (CN) .......................... 202210677980.3

(51) Int. Cl.
*H01L 23/473*    (2006.01)
*G06F 1/20*    (2006.01)

(52) U.S. Cl.
CPC .............. *G06F 1/20* (2013.01); *H01L 23/473* (2013.01); *G06F 2200/201* (2013.01)

(58) Field of Classification Search
CPC .............. H01L 23/473; H05K 7/20254; H05K 7/20272; G06F 1/20; G06F 2200/201
See application file for complete search history.

(56) References Cited

U.S. PATENT DOCUMENTS

| 4,500,821 A | 2/1985 | Bitting et al. |
| 5,052,472 A | 10/1991 | Takahashi et al. |

(Continued)

FOREIGN PATENT DOCUMENTS

| CN | 201165989 Y | 12/2008 |
| CN | 202914337 A | 5/2013 |

(Continued)

OTHER PUBLICATIONS

Chinese Patent Application No. 201611132425.3 filed Dec. 9, 2016 with English translation.

(Continued)

*Primary Examiner* — Eric S Ruppert
(74) *Attorney, Agent, or Firm* — Merchant & Gould P.C.

(57) ABSTRACT

A cooling apparatus includes a casing, pumping unit, and heat exchange unit. The pumping unit includes a body and housing. The body includes a wishbone-shaped indentation and lollipop shaped indentation separate from the wishbone-shaped indentation. The housing includes a wishbone-shaped flow path and lollipop-shaped flow path separate from the wishbone-shaped flow path. The body is coupled to the housing such that the wishbone-shaped indentation and the wishbone-shaped flow path define a first flow path and the lollipop-shaped indentation and the lollipop-shaped flow path define a second flow path. The pumping unit is coupled to the heat exchange chamber such that the first flow path and the second flow path is in fluid communication with the heat exchange chamber via a first end opening and second end opening, and third opening, respectively.

20 Claims, 25 Drawing Sheets

Related U.S. Application Data is a continuation of application No. 16/530,665, filed on Aug. 2, 2019, now Pat. No. 11,320,874, which is a continuation of application No. 15/433,073, filed on Feb. 15, 2017, now Pat. No. 10,409,341.

(60) Provisional application No. 62/295,149, filed on Feb. 15, 2016.

(56) References Cited

U.S. PATENT DOCUMENTS

| | | |
|---|---|---|
| 5,738,496 A | 4/1998 | Mehta |
| 6,054,676 A | 4/2000 | Wall et al. |
| 6,120,262 A | 9/2000 | McDonough et al. |
| 6,167,952 B1 | 1/2001 | Downing |
| 6,213,617 B1 | 4/2001 | Barker |
| 6,966,359 B1 | 11/2005 | Liu |
| 7,007,506 B2 | 3/2006 | Kubo et al. |
| 7,055,581 B1 | 6/2006 | Roy |
| 7,183,939 B1 | 2/2007 | Lo et al. |
| 7,240,722 B2 | 7/2007 | Lai et al. |
| 7,249,625 B2 | 7/2007 | Duan |
| 7,325,591 B2 | 2/2008 | Duan et al. |
| 8,051,898 B2 | 11/2011 | Chiang |
| 8,240,362 B2 | 8/2012 | Eriksen |
| 8,245,764 B2 | 8/2012 | Eriksen |
| 8,261,813 B2 | 9/2012 | Oikawa |
| 8,746,330 B2 | 6/2014 | Lyon |
| 9,345,169 B1 | 5/2016 | Campbell et al. |
| 9,441,640 B2 | 9/2016 | Park et al. |
| 9,795,058 B2 | 10/2017 | Tsai |
| 2003/0049124 A1 | 3/2003 | Liu |
| 2004/0130874 A1 | 7/2004 | Maveety et al. |
| 2005/0128702 A1 | 6/2005 | Mongia et al. |
| 2005/0241806 A1 | 11/2005 | Liu |
| 2006/0133920 A1 | 6/2006 | Chen |
| 2006/0185378 A1 | 8/2006 | Duan et al. |
| 2006/0225867 A1 | 10/2006 | Park et al. |
| 2007/0076374 A1 | 4/2007 | Mongia et al. |
| 2008/0029260 A1 | 2/2008 | Hu et al. |
| 2009/0101316 A1 | 4/2009 | Han et al. |
| 2009/0122572 A1 | 5/2009 | Page et al. |
| 2009/0159244 A1 | 6/2009 | Mounioloux |
| 2009/0284921 A1 | 11/2009 | Colgan et al. |
| 2012/0152495 A1 | 6/2012 | Tan |
| 2012/0152498 A1 | 6/2012 | Lyon |
| 2012/0175094 A1 | 7/2012 | Rice |
| 2013/0008628 A1 | 1/2013 | Tiengtum et al. |
| 2013/0051108 A1 | 2/2013 | Nagao et al. |
| 2015/0021756 A1 | 1/2015 | Adachi |
| 2016/0309618 A1 | 10/2016 | Tsai et al. |
| 2016/0338223 A1 | 11/2016 | Tsai et al. |
| 2016/0363967 A1 | 12/2016 | Tsai |
| 2017/0045300 A1 | 2/2017 | Boday et al. |
| 2017/0045306 A1 | 2/2017 | Tsai |
| 2017/0045307 A1 | 2/2017 | Tsai |
| 2017/0118870 A1 | 4/2017 | Yin et al. |
| 2017/0192471 A1 | 7/2017 | Tsai et al. |
| 2017/0235350 A1 | 8/2017 | Tsai |
| 2018/0139865 A1 | 5/2018 | Draht et al. |
| 2018/0163960 A1 | 6/2018 | Lin |
| 2018/0213677 A1 | 7/2018 | Wu et al. |
| 2018/0259267 A1 | 9/2018 | Tsai et al. |
| 2018/0332734 A1 | 11/2018 | Bandorawalla et al. |
| 2018/0340744 A1 | 11/2018 | Tsai et al. |

FOREIGN PATENT DOCUMENTS

| | | |
|---|---|---|
| CN | 103133372 A | 6/2013 |
| DE | 102011121064 A1 | 6/2013 |
| JP | S61-018159 A | 1/1986 |
| KR | 10-0529825 B1 | 11/2005 |
| TW | M278938 U | 10/2005 |
| TW | M311234 U | 5/2007 |
| TW | M325534 U | 1/2008 |
| TW | M522274 U | 5/2016 |

OTHER PUBLICATIONS

Chinese Patent Application CN 201511023351.5 filed Dec. 30, 2015 with English translation.
Non-Final Office Action issued in U.S. Appl. No. 15/433,073, dated Jun. 22, 2018.
Final Office Action issued in U.S. Appl. No. 14/988,753, dated Jan. 11, 2019.
Non-Final Office Action issued in U.S. Appl. No. 14/988,753, dated Aug. 8, 2018.
Final Office Action issued in U.S. Appl. No. 14/988,753, dated Jan. 16, 2018.
Non-Final Office Action issued in U.S. Appl. No. 14/988,753, dated Jul. 31, 2017.
Non-Final Office Action issued in U.S. Appl. No. 15/395,954, dated Feb. 15, 2019.
Final Office Action issued in U.S. Appl. No. 15/433,073, dated Nov. 13, 2018.
Non-Final Office Action issued in U.S. Appl. No. 15/394,410, dated Sep. 21, 2018.
Final Office Action issued in U.S. Appl. No. 15/394,410, dated Jan. 11, 2019.
Notice of Allowance issued in U.S. Appl. No. 15/394,410, dated Apr. 10, 2019.
Notice of Allowance issued in U.S. Appl. No. 15/433,073, dated Apr. 29, 2019.
Final Office Action issued Jan. 28, 2021 in U.S. Appl. No. 16/530,665.
Yang, et al., "Development of a Mini Liquid Cooling System for High-Heat Flux Electronic Devices", Heat Transfer Devices, Heat Transfer Engineering (Year: 2011).
Notice of Allowance issued Jun. 16, 2022 in U.S. Appl. No. 16/783,110.
Office Action issued Nov. 1, 2021 in U.S. Appl. No. 16/783,110.
Office Action issued Jun. 30, 2021 in U.S. Appl. No. 16/783,110.
Office Action issued Mar. 25, 2021 in U.S. Appl. No. 16/783,110.
Office Action issued Mar. 2, 2022 in U.S. Appl. No. 16/783,110.

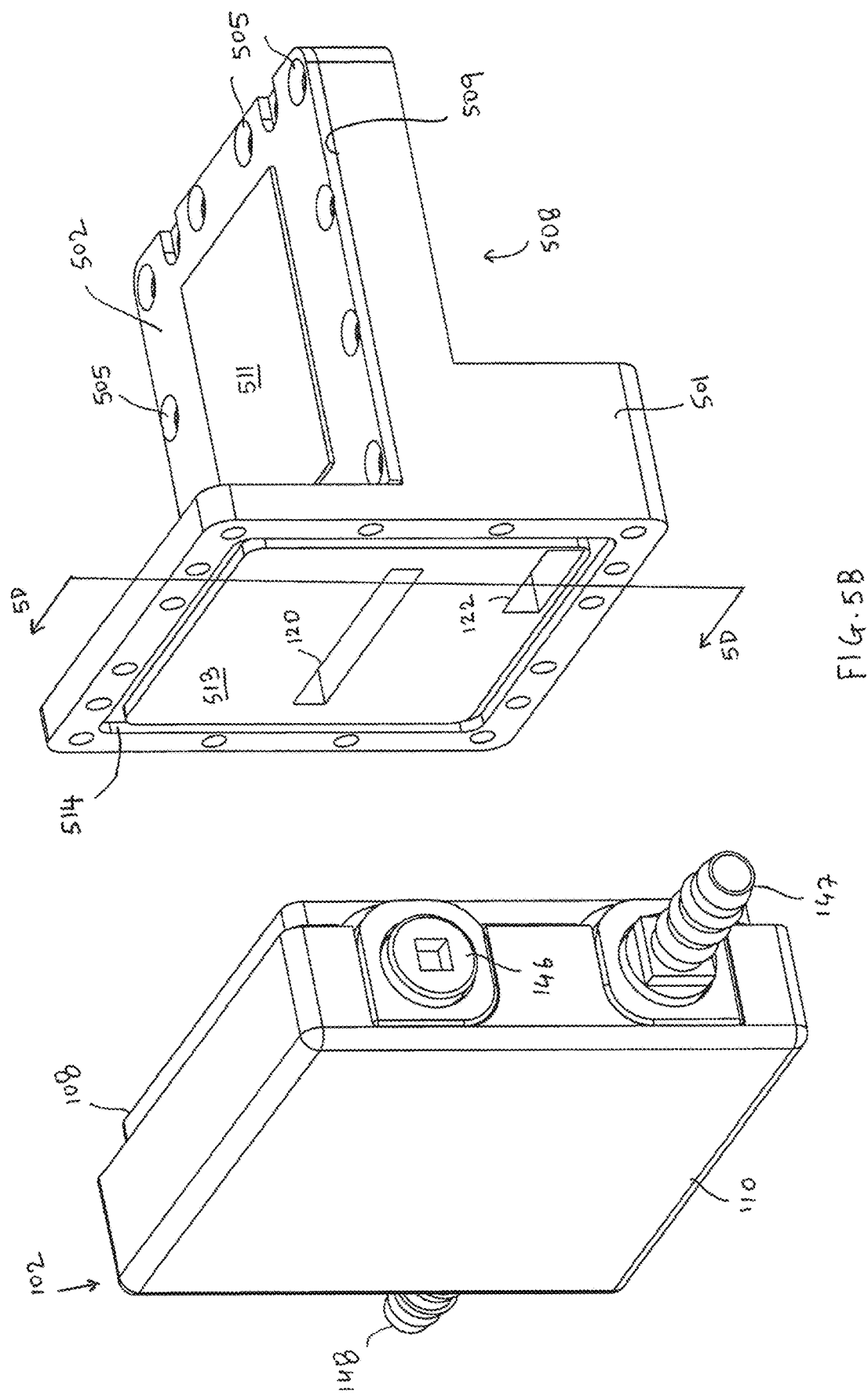

COOLING APPARATUS

CROSS-REFERENCE TO RELATED APPLICATIONS

This application is a continuation-in-part of and claims priority under 35 U.S.C. § 120 to U.S. application Ser. No. 16/783,110 filed Feb. 5, 2020, which is a continuation of and claims priority under 35 U.S.C. § 120 to U.S. patent application Ser. No. 16/530,665, filed on Aug. 2, 2019, now U.S. Pat. No. 11,320,874, which is a continuation of and claims priority under 35 U.S.C. § 120 to U.S. application Ser. No. 15/433,073, filed Feb. 15, 2017, now U.S. Pat. No. 10,409,341, which claims the benefit of priority under 35 U.S.C. § 119 to U.S. Provisional Application No. 62/295,149, filed Feb. 15, 2016. This application also claims priority under 35 U.S.C. § 119 to Chinese Application 202210677980.3 filed Jun. 15, 2022, in the China National Intellectual Property Administration. The contents of all these applications are hereby incorporated by reference in their entirety.

TECHNICAL FIELD

Example embodiments relate to heat dissipation using fluid and, more particularly, to cooling apparatuses using a circulating cooling fluid that dissipates heat generated by processing units (e.g., CPUs, GPUs, etc.) used in a computer.

BACKGROUND

With the increase of the processing speed and performance of electronic components, such as central processing units (CPU), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a water cooling apparatus is used for cooling the electronic component and, thereby maintaining normal operation of the electronic component.

Existing fluid cooling apparatuses typically include a base plate of a heat exchange chamber attached to a CPU, and the heat exchange chamber is fluidly connected to a fluid circulating pump. The pump circulates the fluid inside the heat exchange chamber in order to deliver the fluid at lower temperature to the heat exchange chamber. As the fluid circulates in the heat exchange chamber, thermal energy is exchanged between the base plate and the fluid and, as a result, the temperature of the base plate is reduced and the temperature of the fluid increases. However, existing pumps are often proprietary and this causes a reduction in the heat transfer efficiency and leakage when maintenance or parts replacement is required.

Also, existing fluid cooling apparatuses are not modulated to be adjustable to dissipate heat from more than one electronic component at a time.

SUMMARY

Various aspects of the present disclosure provide a cooling apparatus for dissipating heat generated by electronic components.

According to one aspect of the present disclosure, the cooling apparatus includes a base plate, a top plate, a pumping unit, and a casing. The casing is positioned on the pumping unit and at least partially encloses the pumping unit. The base plate is configured to dissipate heat. The top plate is coupled to the base plate and together define a heat exchange chamber. The top plate includes a first opening and a second opening. The first opening and the second opening is positioned above the heat exchange chamber. The first opening and the second opening is in fluid communication with the heat exchange chamber. The pumping unit is disposed on the base plate and over the first opening and the second opening. The pumping unit is configured to circulate fluid into and out of the heat exchange chamber. The pumping unit includes a housing, a body, a rotor cover plate and a motor control circuit. The motor control circuit is disposed on the body, the body is disposed on the rotor cover plate, the body disposed on the rotor cover plate is at least partially installed in the housing. The motor control circuit controls the cooling apparatus. The rotor cover plate includes a wishbone shaped indentation and a lollipop shaped indentation. The lollipop-shaped indentation separated from the wishbone-shaped indentation. The housing includes a bottom inner surface. The bottom inner surface includes a first end opening, a second end opening, a third opening, and a support structure. The support structure includes a wishbone-shaped flow path and a lollipop-shaped flow path separated from the wishbone-shaped flow path. The first end opening and the second end opening are defined at opposite leg ends of a wishbone portion of the wishbone-shaped flow path. The third opening is defined at an end of a stick portion of the lollipop-shaped flow path. The rotor cover plate is substantially flat and the support structure is substantially flat. The body disposed on the rotor cover plate is coupled to the housing such that the wishbone-shaped indentation and the wishbone-shaped flow path define a first flow path. The lollipop-shaped indentation and the lollipop-shaped flow path define a second flow path separated from the first flow path. The pumping unit is coupled to the heat exchange chamber such that the first flow path is in fluid communication with the heat exchange chamber through the first opening via the first end opening and the second end opening. The second flow path is in fluid communication with the heat exchange chamber through the second opening via the third opening.

According to another aspect of the present disclosure, the body includes a stator portion and a rotor portion. The rotor portion includes a plurality of blades disposed on a flat circular surface of the rotor portion. The rotor cover plate includes a fourth opening and a fifth opening. The fourth opening in fluid communication with the first flow path and the fifth opening in fluid communication with the second flow path. The pumping unit is coupled to the heat exchange chamber such that the first flow path is in fluid communication with the heat exchange chamber through the first opening via the fourth opening and first end opening and the second end opening. The pumping unit is coupled to the heat exchange chamber such that the second flow path is in fluid communication with the heat exchange chamber through the second opening via the fifth opening and the third opening.

According to another aspect of the present disclosure, the heat exchange unit includes a plurality of fins, the first opening includes a first elongated slot, and the second opening includes an ovular shaped opening. The first elongated slot is defined at a center of the top plate. The second opening is defined at a corner of the top plate. The top plate is coupled to the base plate such that the first elongated slot is perpendicular to the plurality of fins.

According to another aspect of the present disclosure, the motor control circuit is substantially flat and includes at least one light source. The motor control circuit controls the at least one light source to turn on and off. Light from the at least one light source is at least partially emitted from the cooling apparatus via the cover.

According to another aspect of the present disclosure, the body disposed on the rotor cover plate and the housing are coupled together by fasteners. According to an aspect of the present disclosure, the cooling apparatus further includes a fourth sealing element disposed between the body disposed on the rotor cover plate. The fourth sealing element surrounds a transition flow path indentation of the body, a transition flow path of the rotor cover plate, and the fourth opening, and an outlet flow path of the body, a second cavity of the body, a rotor blade receiving portion of the rotor cover plate, and the fifth opening.

According to another aspect of the present disclosure, the body and the housing are coupled together by fasteners. According to an aspect of the present disclosure, the cooling apparatus further includes a third sealing element disposed between the rotor cover plate and the housing. The third sealing element surrounds the fourth opening, the first flow path, the first end opening, and the second end opening, and the fifth opening, the second flow path, and the third opening.

According to another aspect of the present disclosure, the pumping unit and the base plate are coupled together by fasteners. According to an aspect of the present disclosure, the cooling apparatus further includes a first sealing element disposed between the pumping unit and the top plate and a second sealing element disposed between the pumping unit and the top plate. The first sealing element surrounds the first end opening, the second end opening, a bottom housing indentation of the housing, and the first opening. The second sealing element surrounds the first end opening, the second end opening, the bottom housing indentation, and the first opening and the third opening and the second opening.

According to one aspect of the present disclosure, the method of operating the cooling apparatus includes receiving fluid into a pumping unit via a corresponding inlet of the pumping unit, transferring the fluid into a heat exchange chamber via a first flow path, a first end opening, a second end opening, and a first opening, transferring the fluid into the pumping unit via a second opening, a third opening, and a second flow path, and outputting the fluid from the pumping unit via a corresponding outlet of the pumping unit. The cooling apparatus includes base plate, a top plate, the pumping unit, and a casing. The casing is positioned on the pumping unit and at least partially encloses the pumping unit. The base plate is configured to dissipate heat. The top plate is coupled to the base plate and together define a heat exchange chamber. The top plate includes a first opening and a second opening. The first opening and the second opening is positioned above the heat exchange chamber. The first opening and the second opening is in fluid communication with the heat exchange chamber. The pumping unit is disposed on the base plate and over the first opening and the second opening. The pumping unit is configured to circulate fluid into and out of the heat exchange chamber. The pumping unit includes a housing, a body, a rotor cover plate and a motor control circuit. The motor control circuit is disposed on the body, the body is disposed on the rotor cover plate, the body disposed on the rotor cover plate is at least partially installed in the housing. The motor control circuit controls the cooling apparatus. The rotor cover plate includes a wishbone shaped indentation and a lollipop shaped indentation. The lollipop-shaped indentation separated from the wishbone-shaped indentation. The housing includes a bottom inner surface. The bottom inner surface includes a first end opening, a second end opening, a third opening, and a support structure. The support structure includes a wishbone-shaped flow path and a lollipop-shaped flow path separated from the wishbone-shaped flow path. The first end opening and the second end opening are defined at opposite leg ends of a wishbone portion of the wishbone-shaped flow path. The third opening is defined at an end of a stick portion of the lollipop-shaped flow path. The rotor cover plate is substantially flat and the support structure is substantially flat. The body disposed on the rotor cover plate is coupled to the housing such that the wishbone-shaped indentation and the wishbone-shaped flow path define a first flow path. The lollipop-shaped indentation and the lollipop-shaped flow path define a second flow path separated from the first flow path. The pumping unit is coupled to the heat exchange chamber such that the first flow path is in fluid communication with the heat exchange chamber through the first opening via the first end opening and the second end opening. The second flow path is in fluid communication with the heat exchange chamber through the second opening via the third opening.

According to another aspect of the present disclosure, the method further includes transferring the fluid into the heat exchange chamber via the fourth opening, the first flow path, the first end opening, the second end opening, and the first opening, and transferring the fluid into the pumping unit via the second opening, the third opening, the second flow path, and the fifth opening. The body includes a stator portion and a rotor portion. The rotor portion includes a plurality of blades disposed on a flat circular surface of the rotor portion. The rotor cover plate includes a fourth opening and a fifth opening. The fourth opening in fluid communication with the first flow path and the fifth opening in fluid communication with the second flow path. The pumping unit is coupled to the heat exchange chamber such that the first flow path is in fluid communication with the heat exchange chamber through the first opening via the fourth opening and first end opening and the second end opening. The pumping unit is coupled to the heat exchange chamber such that the second flow path is in fluid communication with the heat exchange chamber through the second opening via the fifth opening and the third opening.

According to another aspect of the present disclosure, the heat exchange unit of the method includes a plurality of fins, the first opening of the method includes a first elongated slot, and the second opening of the method includes an ovular shaped opening. The first elongated slot is defined at a center of the top plate. The second opening is defined at a corner of the top plate. The top plate is coupled to the base plate such that the first elongated slot is perpendicular to the plurality of fins.

According to another aspect of the present disclosure, the motor control circuit of the method is substantially flat and includes at least one light source. The motor control circuit controls the at least one light source to turn on and off. Light from the at least one light source is at least partially emitted from the cooling apparatus via the cover.

According to another aspect of the present disclosure, the body disposed on the rotor cover plate and the housing of the method are coupled together by fasteners. According to an aspect of the present disclosure, the cooling apparatus of the method further includes a fourth sealing element disposed between the body disposed on the rotor cover plate. The fourth sealing element surrounds a transition flow path indentation of the body, a transition flow path of the rotor cover plate, and the fourth opening, and an outlet flow path of the body, a second cavity of the body, a rotor blade receiving portion of the rotor cover plate, and the fifth opening.

According to another aspect of the present disclosure, the body and the housing of the method are coupled together by fasteners. According to an aspect of the present disclosure, the cooling apparatus of the method further includes a third sealing element disposed between the rotor cover plate and the housing. The third sealing element surrounds the fourth opening, the first flow path, the first end opening, and the second end opening, and the fifth opening, the second flow path, and the third opening.

According to another aspect of the present disclosure, the pumping unit and the base plate of the method are coupled together by fasteners. According to an aspect of the present disclosure, the cooling apparatus of the method further includes a first sealing element disposed between the pumping unit and the top plate and a second sealing element disposed between the pumping unit and the top plate. The first sealing element surrounds the first end opening, the second end opening, a bottom housing indentation of the housing, and the first opening. The second sealing element surrounds the first end opening, the second end opening, the bottom housing indentation, and the first opening and the third opening and the second opening.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIGS. 5B and 5C are different perspective views of the cooling apparatus of FIG. 5A in a disassembled state.

DETAILED DESCRIPTION

Embodiments described herein are directed to a cooling apparatus that can dissipate heat generated from multiple heat generating sources and thereby increase heat transfer efficiency. Embodiments disclosed are also directed to a cooling apparatus that occupies a reduced space compared to prior art cooling apparatuses.

Figure 1A:
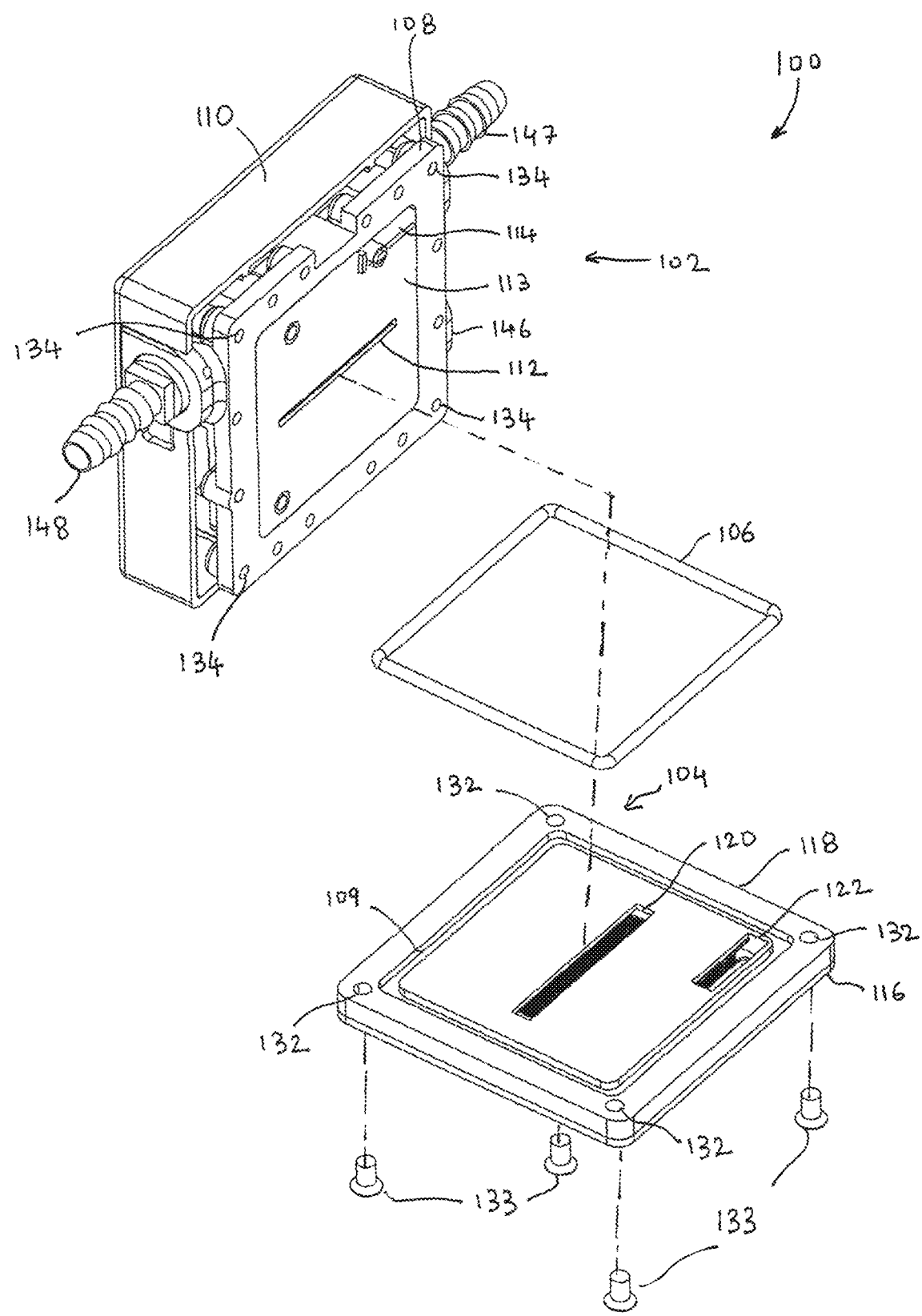
FIG. 1A illustrates an exploded view of a cooling apparatus, according to disclosed embodiments.

FIG. 1A is an exploded view of a cooling apparatus 100, according to embodiments disclosed herein. As illustrated, the cooling apparatus 100 includes a pumping unit 102 that is disposed on a cooling unit 104. The pumping unit 102 includes a pump housing 108 and a casing 110 sized or otherwise configured to receive the pump housing 108 therein. Although not explicitly illustrated, a pump for circulating fluid between the pumping unit 102 and the cooling unit 104 may be disposed in the pump housing 108. The operating speed of the pumping unit 102 may be based on or otherwise related to the rotational speed of the pump. The pump housing 108 includes inlets 146 and 148 via which the fluid enters the pumping unit 102 and an outlet 147 via which the fluid exits the pumping unit 102. In an embodiment, the inlets 146, 148 can be used selectively, and any unused inlet may be plugged. For instance, in FIG. 1A, the inlet 146 is plugged.

The fluid may be circulated between the pumping unit 102 and the cooling unit 104 via a first opening 112 and a second opening 114 defined in the pump housing 108. Briefly, during operation, fluid may enter the pumping unit 102 via the inlets 146 and/or 148 and then flow into the cooling unit 104 via the first opening 112. The fluid may then enter the pumping unit 102 via the second opening 114 and exit the pumping unit 102 via the outlet 147. The first and second openings 112 and 114 are not limited to having any particular shape, and the first and second openings 112 and 114 may be elongated slots, square, circular, polygonal, or of any desired shape, and may have any desired size, without departing from the scope of the disclosure.

The cooling unit 104 may include a base plate 116 and a cover 118 that is sized or otherwise configured to receive the base plate 116. As illustrated, the cover 118 defines a first opening 120 and a second opening 122. The first and second openings 120 and 122 may correspond to the openings 112 and 114 defined in the pump housing 108. In order to provide efficient fluid transfer between the pumping unit 102 and the cooling unit 104, the first and second openings 120 and 122 may have the same shape and size as the openings 112 and 114 defined in the pump housing 108. Further, the opening 120 and 122 may be sized and shaped such that the opening 112 coincides with the opening 120, and the opening 114 coincides with the opening 122 when the pumping unit 102 is positioned on the cooling unit 104.

Thus, as illustrated, the first and second openings 120 and 122 may be shaped as elongated slots extending parallel to each other in the top plate 11, and the first opening 120 may be longer than the second opening 122. However, the openings 120 and 122 may be square, circular, polygonal, or of any shape and size as the openings 112 and 114, without departing from the scope of the disclosure.

A sealing element 106 (e.g., a gasket, an O-ring, a washer, and the like) may be disposed at an interface between the pumping unit 102 and the cooling unit 104 to prevent fluid that flows between the pumping unit 102 and the cooling unit 104 from leaking out of the cooling apparatus 100.

Figure 1B:
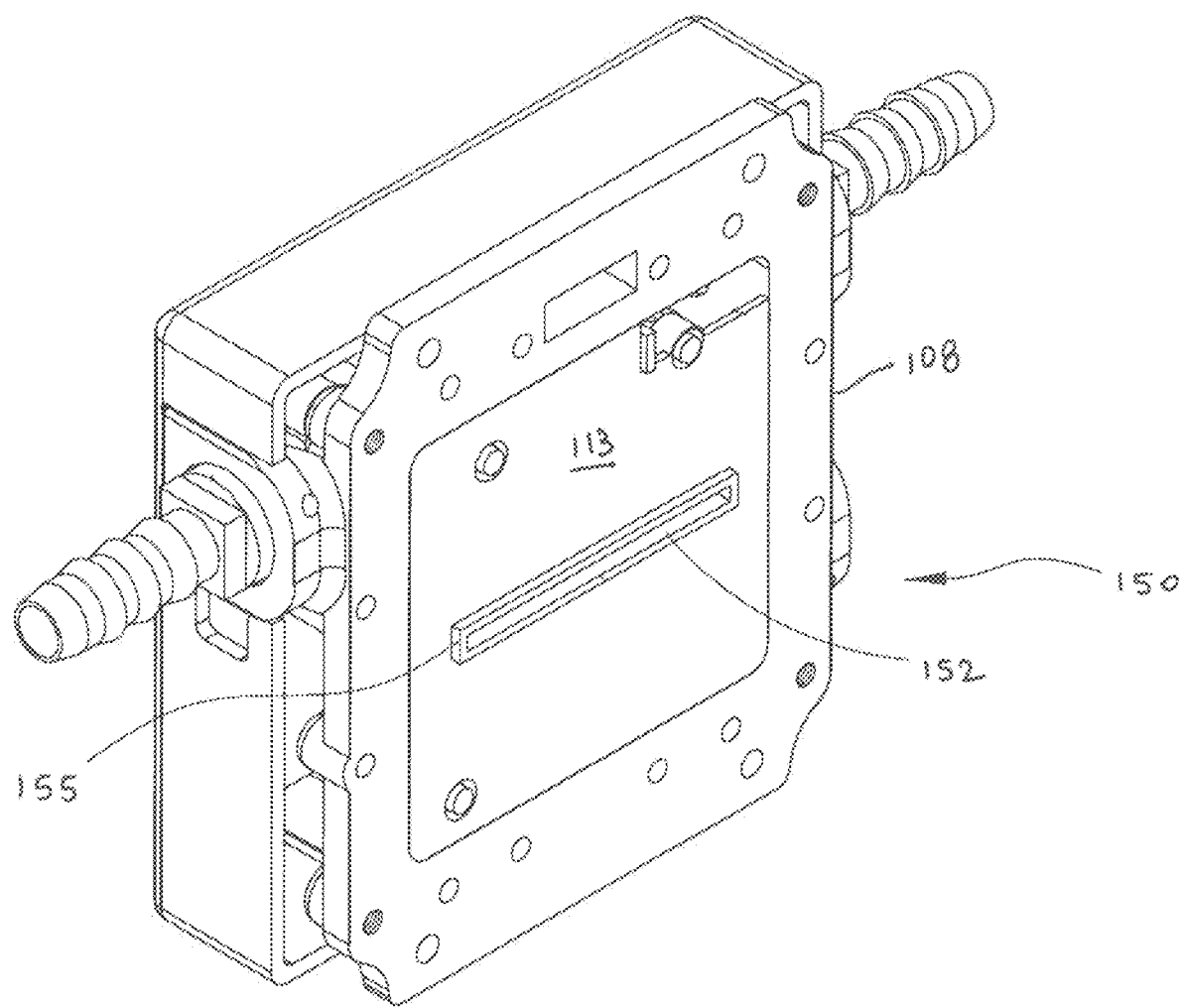
FIG. 1B illustrates a prior art pumping unit having a flange at an opening therein.

FIG. 1B illustrates a prior art pumping unit 150 having a flange 155 at the opening 152. The pumping unit 150 may be installed in the cooling unit 104 (FIG. 1A) and the flange 155 may guide the fluid from the pumping unit 150 into the cooling unit 104 via the opening 120. The flange 155 may be shaped and sized to fit into the opening 120 when the pumping unit 102 is installed on the cooling unit 104. The flange 155 may ensure a correct placement of the pumping unit 102 when installed on the cooling unit, and thereby minimize leakage. However, due to the presence of the flange 155, it is not possible to use the pumping unit 150 with other cooling units having openings that are not sized or otherwise configured to receive the flange 155. This limits the use of the pumping unit 150. The pumping unit 102, according to embodiments disclosed herein, does not include the flange and thus may be used with a variety of cooling units. Because the flange is absent, the bottom surface 113 of the pump housing 108 may be considered to be substantially flat or planar. Specifically, the bottom surface 113 may be substantially flat between the openings 112 and 114, and between the openings 112 and 114 and the peripheral edges of the housing 108.

Figure 2A:
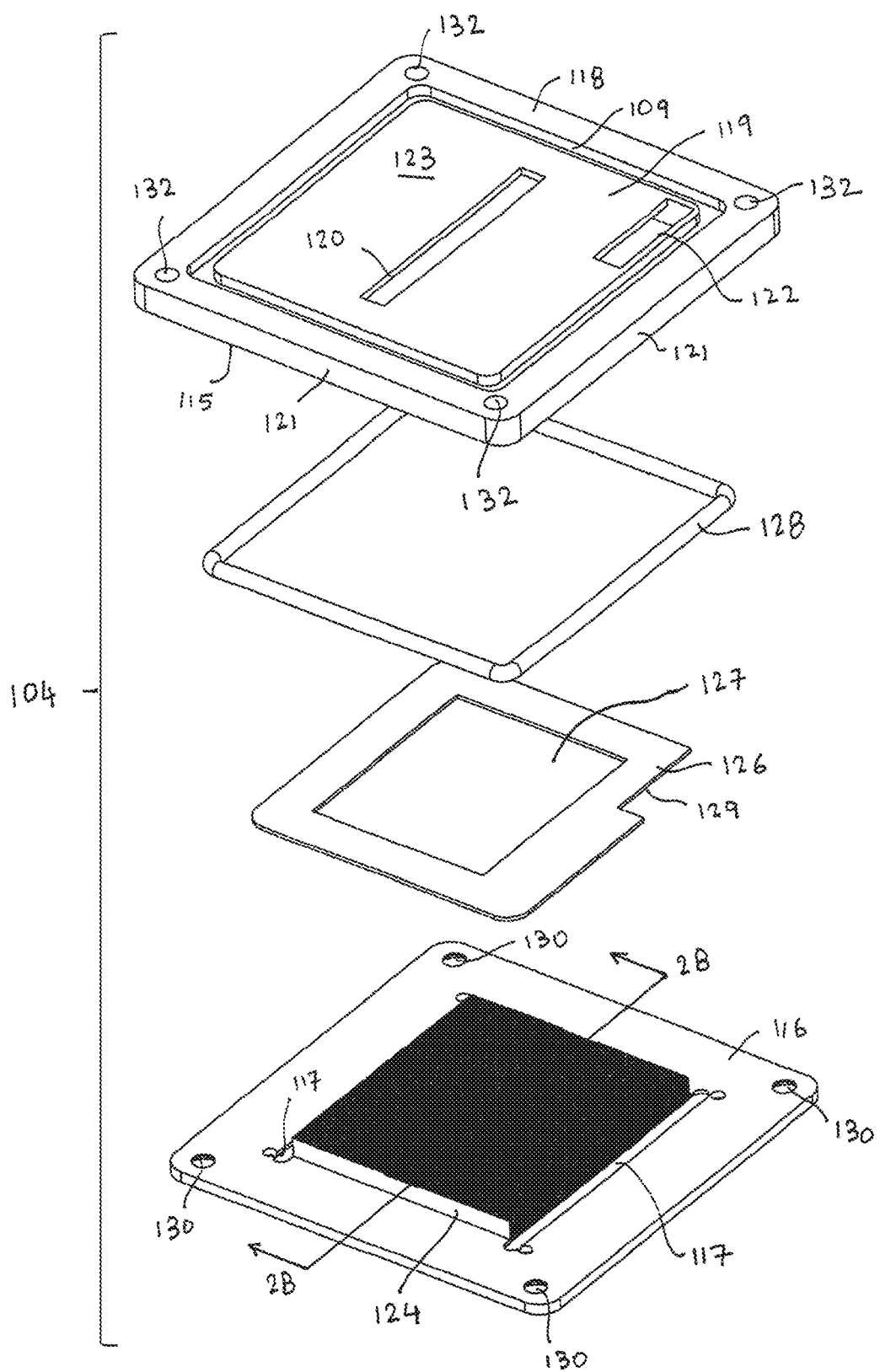
FIG. 2A illustrates an exploded view of the cooling unit of FIG. 1A, according to disclosed embodiments.

FIG. 2A illustrates an exploded view of the cooling unit 104, according to embodiments disclosed herein. As illustrated, the cover 118 includes a top plate 119 having peripheral sidewalls 121 disposed at an edge thereof. The top plate 119 may be generally rectangular or square in shape and the sidewalls 121 may be disposed along the entire periphery of the top plate 119. The top plate 119 and the sidewalls 121 together define or otherwise enclose a space 115. As illustrated, the openings 120 and 122 may be formed in a top surface 123 of the top plate 119 and the openings 120 and 122 are in fluid communication with the space 115. The top surface 123 may also be substantially flat between the openings 120 and 122, and between the openings 120 and 122 and the peripheral sidewalls 121. Referring to FIGS. 1A and 2A, the pumping unit 102 and the cooling unit 104 are coupled to each other via two substantially flat surfaces 113 and 123, and the sealing element 106 disposed therebetween and surrounding the openings 112, 114, 120, and 122. More specifically, the sealing element 106 may be disposed in a recess 109 defined in the surface 123. When the pumping unit 102 and the cooling unit 104 are coupled to each other, the openings 112 and 120 are in fluid communication with each other and the openings 114 and 122 are in fluid communication with each other. In an example, when the pumping unit 102 and the cooling unit 104 are coupled to each other, the openings 112 and 120 (or more specifically, the edges thereof) coincide with each other and the openings 114 and 122 (or more specifically, the edges thereof) coincide with each other.

The base plate 116 may include a heat exchange unit disposed on a side of the base plate 116. In an embodiment and as illustrated, the heat exchange unit may be or include an array of a plurality of fins 124. However, in other embodiments, the heat exchange unit may be or include pins, columns, or any other structure of a desired shape and size for dissipating heat, without departing from the scope of the disclosure. Although not illustrated, an electronic component from which heat is to be dissipated is coupled to a side of the base plate 116 opposite the side including the heat exchange unit. The base plate 116 (or at least a portion thereof) includes a thermally conductive material, such as a metal including copper, aluminum etc., or non-metal thermally conductive material, such as graphite etc. The fins 124 (or at least a portion thereof) may also include a thermal conductive material. In an embodiment, the fins 124 and the base plate 116 may be integrally formed as a single piece. In another embodiment, the fins 124 may be coupled to the base plate 116 using known techniques.

Figure 2B:
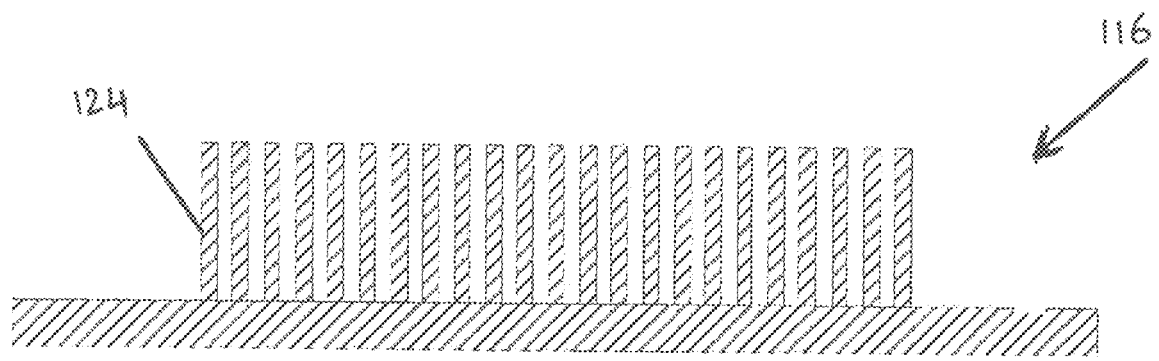
FIG. 2B illustrates a cross-sectional view of the base plate of FIG. 2A taken along the line 2B-2B, according to disclosed embodiments.

Referring briefly to FIG. 2B, illustrated is a cross-sectional view of the base plate 116 taken along the line 2B-2B, according to embodiments disclosed herein. As illustrated, the fins 124 extend transversely on the base plate 116 along the length (or width) thereof, and are arranged parallel to each other and perpendicular to the base plate 116. However, in other embodiments, some or all of the fins 124 may be non-parallel to each other and may be arranged on the base plate 116 at an angle less than 90°. The array of fins 124 may occupy a generally central portion of the base plate 116.

Returning to FIG. 2A, the base plate 116 may define recesses 117 adjacent and in fluid communication with the array of fins 124 and on opposite sides thereof. As illustrated, the recesses 117 may extend perpendicular to the fins 124. The recesses 117 may collect and/or guide the fluid along the array of fins 124.

The cooling unit 104 may also include a pad 126 that may be positioned on the base plate 116. The pad 126 may be positioned on the base plate 116 between the fins 124 and the cover 118 (or more specifically, the sidewalls 121 of the cover 118) when the cover 118 is installed on the base plate 116. The pad 126 defines a through hole 127 located centrally in the pad 126 and a notch 129 on a side of the pad 126. The through hole 127 is sized to receive the plurality of fins 124, and the notch 129 prevents the pad 126 from obstructing the second opening 122 of the cover 118 when the cover is installed on the base plate 116. The pad 126 may occupy the space between the cover 118 and the fins 124 and may prevent leakage of fluid.

The cooling unit 104 may also include a sealing element 128, such as a gasket, O-ring, washer, and the like. When the cooling unit is assembled, the sealing element 128 may be positioned around the pad 126 and between the pad 126 and the cover 118 to further prevent leakage of fluid.

When the cooling unit 104 is assembled by positioning the cover 118 on the base plate 116, the array of fins 124, the pad 126, and the sealing element 128 are received in the space 115. The top plate 119, the sidewalls 121, and the base plate 116 cooperatively define a heat exchange chamber. The cover 118 may be welded to the base plate 116 to secure the cover 118 to the base plate 116. The welding is not limited to any specific type of welding and the cover 118 may be welded to the base plate 116 using any suitable type of welding, without departing from the scope of the disclosure. Other fastening techniques, such as riveting, screwing, press-fitting, and the like, fasteners, such as rivets, screws, nuts, bolts, etc., may be used to secure the cover 118 to the base plate 116.

The base plate 116 may be positioned on the cover 118 such that the first opening 120 is positioned over the fins 124 (or any other heat exchange unit used). Referring to FIGS. 1A and 2A, the base plate 116 may be positioned such that the fins 124 extend in a direction perpendicular to the direction in which the first opening 120 and the second opening 122 extend. Stated otherwise, the fins 124 extend in a direction from the first opening 120 to the second opening 122. The base plate 116 is attached to an electronic component (e.g., a central processing unit (CPU)) from which heat is to be dissipated. Specifically, and as mentioned above, the electronic component from which heat is to be dissipated is attached to the bottom surface (e.g., the surface of the base plate 116 opposite to the surface having the fin 124) using a thermally conductive material (e.g., thermal grease) in order to transfer the heat generated from the electronic component to the base plate 116.

The base plate 116 and the cover 118 may define installation holes 130 and 132, respectively, at the corners thereof. Referring to FIG. 1A, installation holes 134 may also be defined in the pump housing 108. The installation holes 130, 132, and 134 may receive fasteners, such as rivets, screws, nuts, bolts, etc. to secure the pumping unit 102 to the cooling unit 104. In an example, and as illustrated in FIG. 1A, screws 133 are used to secure the pumping unit 102 and the cooling unit 104 together.

Figure 3A:
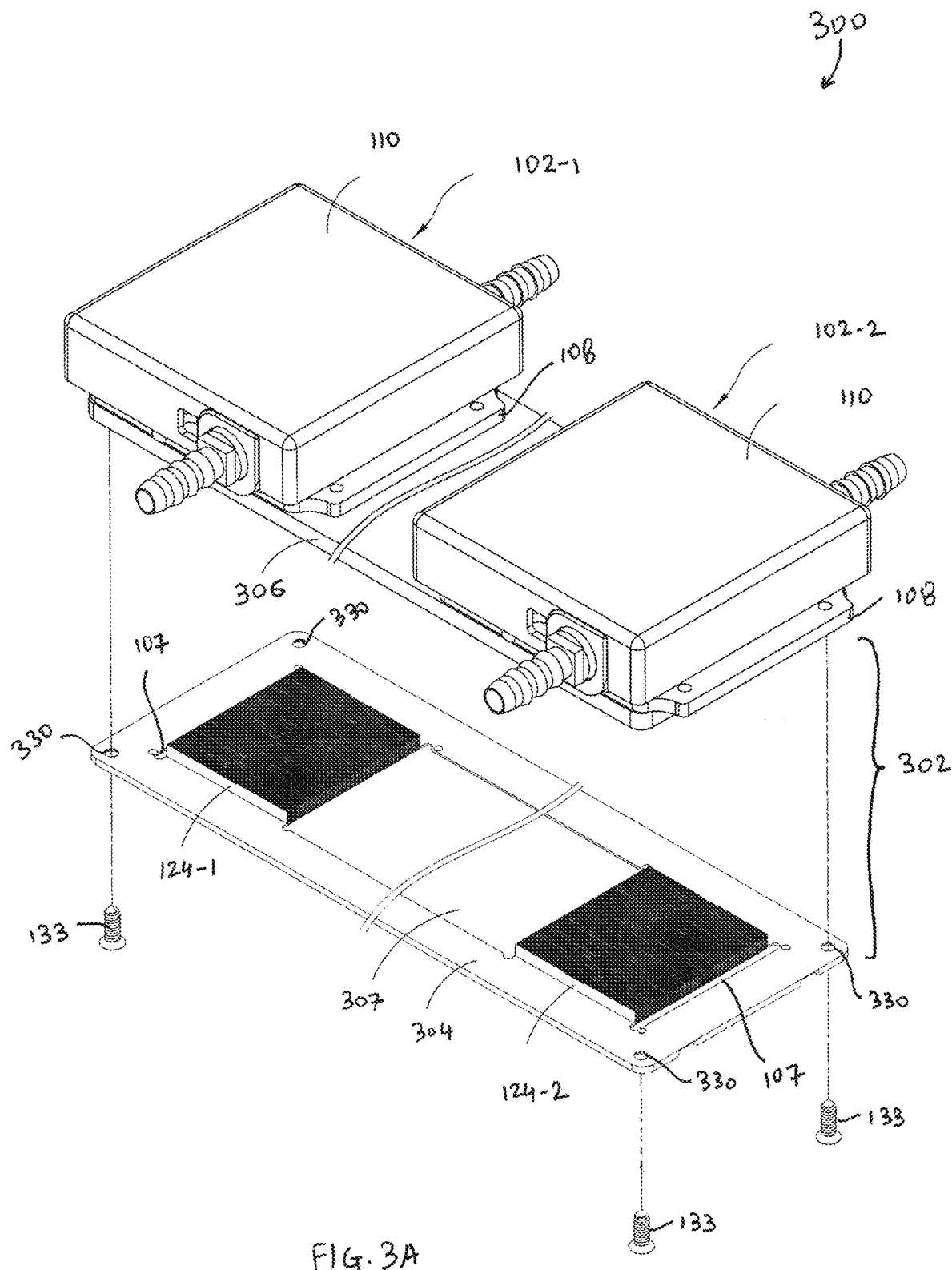
FIG. 3A illustrates a partially exploded view of another embodiment of a disclosed cooling apparatus.

FIG. 3A is a partially exploded view of a cooling apparatus 300, according to embodiments disclosed herein. As illustrated, the cooling apparatus 300 may include two pumping units 102 (labelled as 102-1 and 102-2) of FIG. 1A disposed on a cooling unit 302, shown in exploded view. Although two pumping units 102 are illustrated in FIG. 3A, greater than two pumping units 102 can be included in the cooling apparatus 300, without departing from the scope of the disclosure.

The cooling unit 302 may be similar in some respects to the cooling unit 104 in FIG. 1A, and therefore may be best understood with reference thereto where like numerals designate like components not described again in detail. Unlike the cooling unit 104, the cooling unit 302 may be a generally rectangular structure having the two pumping units 102 disposed on it. In an example, and as illustrated, two pumping unit 102 may be disposed at opposite ends of the cooling unit 302. It will be understood that the cooling unit 302 is not limited to having any particular shape and size, and the cooling unit 302 may have desired shape and size based on, for instance, the application and the number of pumping units 102 disposed on the cooling unit 302, without departing from the scope of the disclosure.

The cooling unit 302 may include a base plate 304 having two arrays of fins 124 (labelled as 124-1 and 124-2) disposed at opposite ends thereof, and a cover 306 that is sized or otherwise configured to receive the base plate 304. The cover 306 may define two sets of openings 120 and 122 (FIG. 1A), each at an end of the cover 306. One set of openings 120 and 122 may be located above the array of fins 124-1 and the other set of openings 120 and 122 may be located above the array of fins 124-2. Each pumping unit 102 may be positioned on the cover 306 and on a set of openings 120 and 122.

Recesses 107 may be at the two opposite ends of the base plate 304 with each recess 107 being in fluid communication with an adjacent array of fins 124-1 or 124-2. As illustrated, a recess 307 may also be defined in the base plate 304 between the arrays of fins 124-1 and 124-2. The recess 307 may be in fluid communication with the arrays of fins 124-1 and 124-2. A separating wall or a ridge 308 may divide the recess 307 into two flow channels 309-1 and 309-2 that are fluidly isolated from each other. As discussed below, cool fluid may be exchanged between the arrays of fins 124-1 and 124-2 via the flow channels 309-1 and 309-2 during operation of the cooling apparatus 300.

The base plate 304 may have installation holes 330 at the corners thereof. Corresponding installation holes (not illustrated) may be provided in the pump housing 108 and the cover 306, as discussed above with reference to FIG. 2A. The cooling unit 302 may be secured to each pumping unit 102 using screws 133 received in the installation holes. However, other kinds of fasteners, such as rivets, nuts, bolts, etc. may also be used to secure the pumping unit 102 and the cooling unit 104 together. In the illustrated embodiment, the sealing element 128 and pad 126 may be omitted from the cooling unit 302. However, in other embodiments the pad 126 and the sealing element 128 may be included in the cooling unit 302, and may be sized or otherwise configured to operate in the cooling unit 302 without restricting the fluid flow between the arrays of fins 124-1 and 124-2.

Figure 3B:
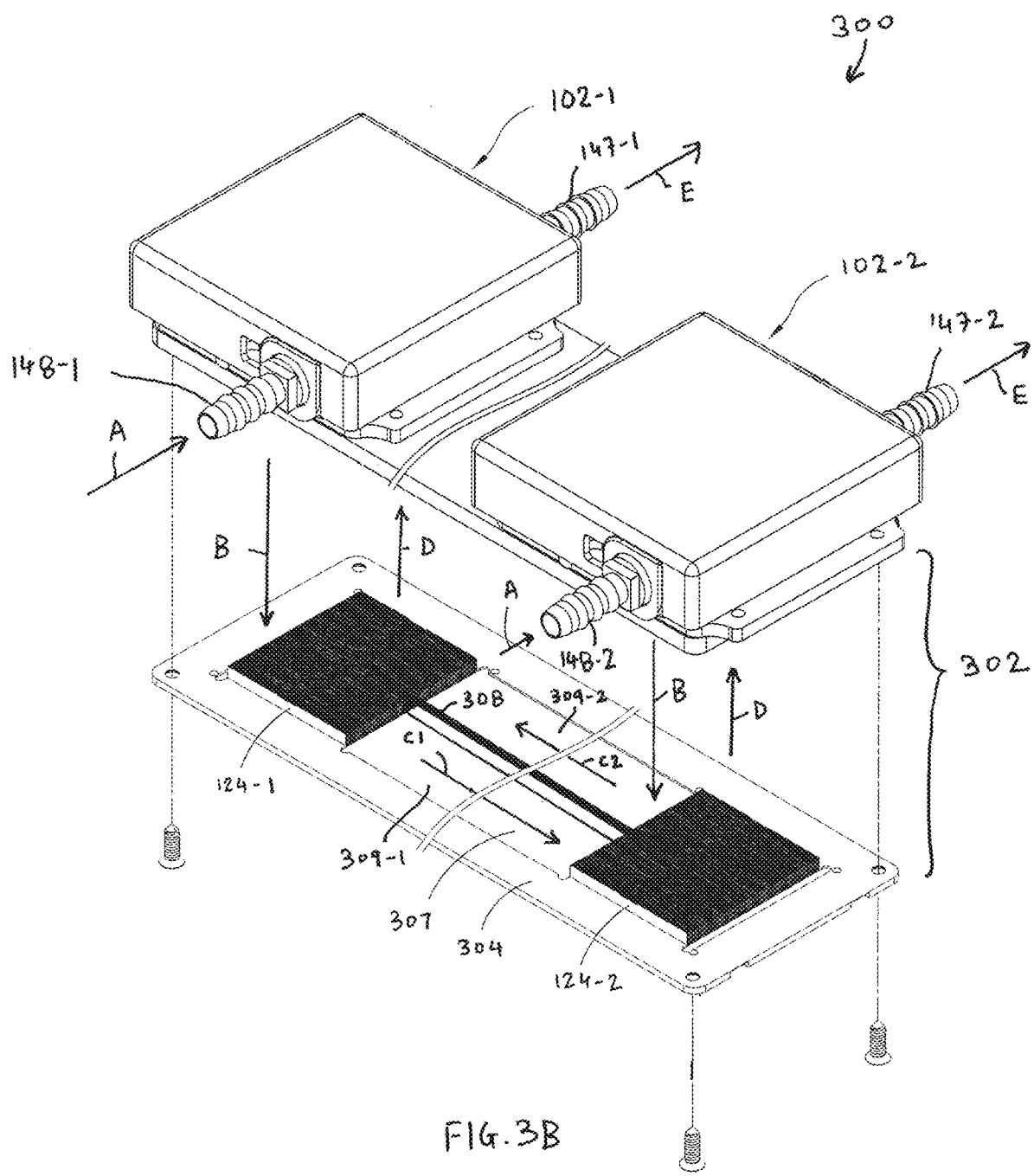
FIG. 3B illustrates a fluid flow in the cooling apparatus of FIG. 3A during operation thereof, according to disclosed embodiments.

FIG. 3B illustrates fluid flow in the cooling apparatus 300 during operation thereof, according to embodiments disclosed herein. For the sake of clarity of illustration, not all components of the cooling apparatus 300 are labelled in FIG. 3B. Each pumping unit 102 may be connected to an individual external heat dissipating device (e.g., a radiator or similar device) or the two pumping unit 102 may share a common external heat dissipating device. Fluid may be circulated between the cooling apparatus 300 and the external heat dissipating device(s). In an example, the inlets 148 (labelled as 148-1 and 148-2) of the pumping units 102 (102-1 and 102-2) may be connected to an outlet of the external heat dissipating device (not expressly illustrated), and the outlets 147 (labelled as 147-1 and 147-2) may be connected to an inlet of the external heat dissipating device.

During operation, relatively cooler fluid from the external heat dissipating device may enter the pumping units 102 via the respective inlets 148-1 and 148-2, as indicated by the arrows A. The cooler fluid may enter the cooling unit 302 and is exposed to the arrays of fins 124-1 and 124-2, as indicated by the arrows B. Inside the cooling unit 302, heat from the base plate 304 and the fins 124 is transferred to the cooler fluid and the temperature of the cooler fluid increases.

The heated fluid (or at least a portion thereof) from the array of fins 124-1 flows to the array of fins 124-2 via the channel 309-1, as indicated by the arrow C1. Similarly, the heated fluid (or at least a portion thereof) from the array of fins 124-2 flows to the array of fins 124-1 via the channel 309-2, as indicated by the arrow C2. By exchanging fluid between the fins 124 additional heat may be dissipated from the base plate 304 and the fins 124, heat transfer efficiency may be increased. The heated fluid may enter the pumping units 102, as indicted by arrows D, and may exit the corresponding pumping units 102 via the outlets 147-1 and 147-2, as indicated by the arrows E. The heated fluid then flows to the external heat dissipating device(s). The external heat dissipating device(s) uses a cooling device, such as a fan, to cool the heated fluid, and the cooler fluid is then provided to the inlets 148-1 and 148-2 for recirculation into the cooling unit 302.

In the embodiment in FIG. 3B, the pumping units 102-1 and 102-2 are referred to as operating in series. Such a configuration increases throughput and may be used for cooling relatively large size integrated circuits (ICs) or other large heat generating devices. To ensure the most efficient operation of the cooling apparatus 300, the pumping units 102-1 and 102-2 may be operated at the same operating speeds.

Figure 4A:
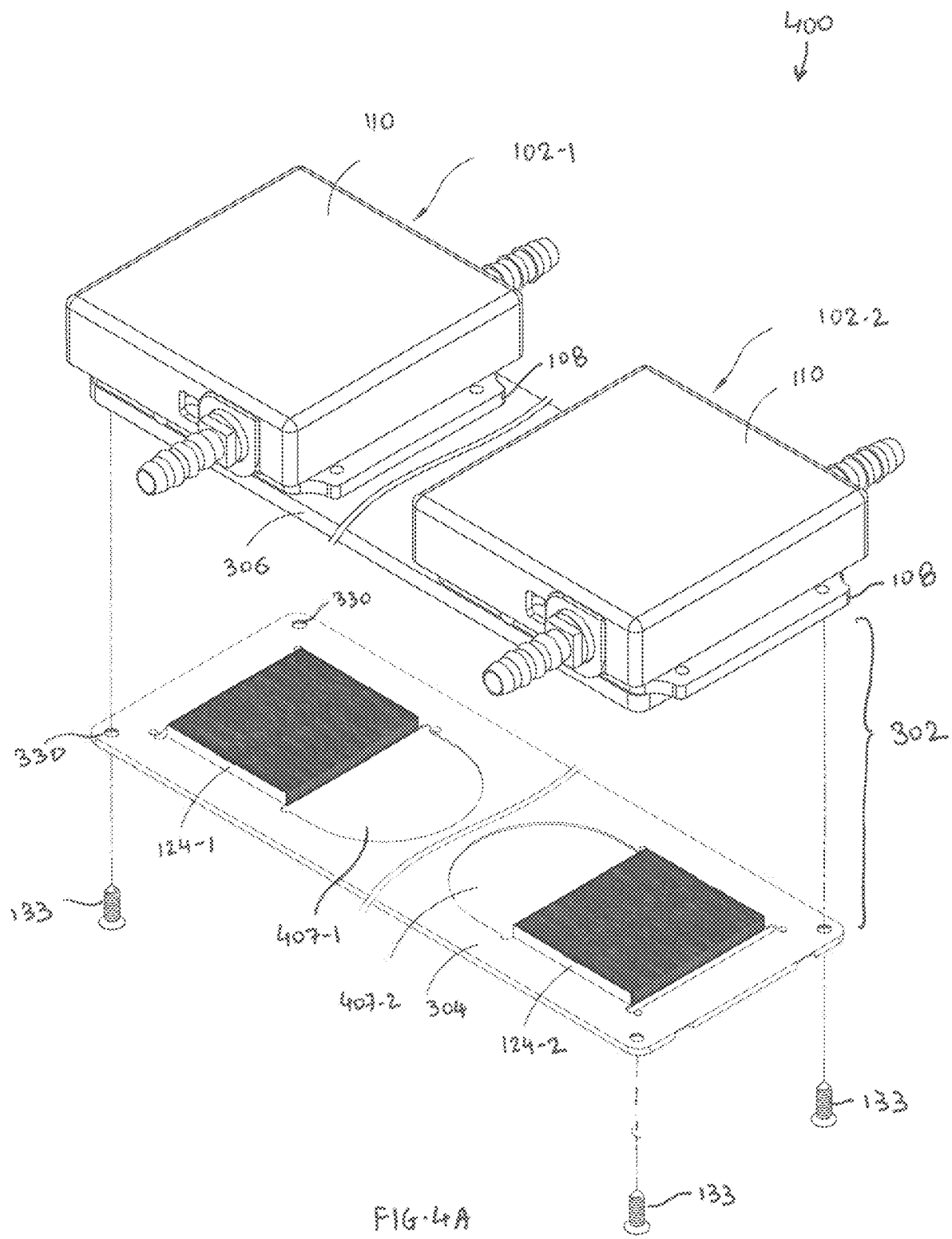
FIG. 4A illustrates a partially exploded view of yet another cooling apparatus, according to another disclosed embodiment.

FIG. 4A is a partially exploded view of a cooling apparatus 400, according to another embodiment disclosed herein. The cooling apparatus 400 may be similar in some respects to the cooling apparatus 300 in FIG. 3A, and therefore may be best understood with reference thereto where like numerals designate like components not described again in detail. In the cooling apparatus 400, the base plate 304 may not include a continuous recess between the arrays of fins 124-1 and 124-2 like the recess 307 in the cooling apparatus 300 of FIG. 3A. As illustrated, the base plate 304 may contain two recesses 407-1 and 407-2 (collectively referred to as recesses 407) that are fluidly separated from each other. In other words, fluid may not transfer between the recesses 407-1 and 407-2. The recess 407-1 may reside adjacent the array of fins 124-1 and may be in fluid communication therewith. The recess 407-2 may reside adjacent the array of fins 124-2 and may be in fluid communication therewith. In FIG. 4A, the recesses 407 are illustrated as having a semicircular shape. However, the recesses 407 are not limited to having any particular shape. Further, both recesses 407 may have the same shape or each recess 407 may have a different shape.

Figure 4B:
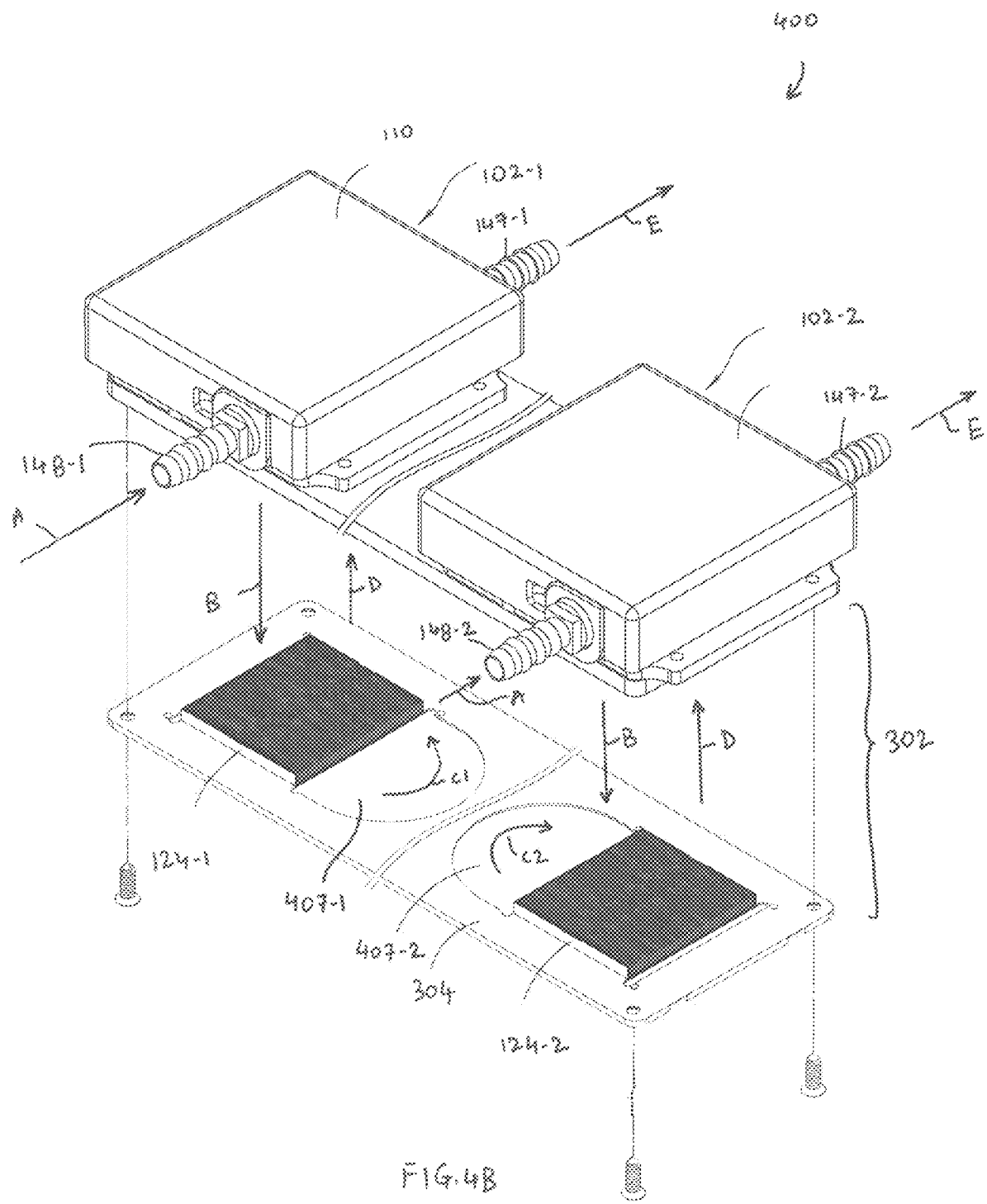
FIG. 4B illustrates a fluid flow in the cooling apparatus of FIG. 4A during operation thereof, according to disclosed embodiments.

FIG. 4B illustrates fluid flow in the cooling apparatus 400 during operation thereof, according to embodiments disclosed herein. For the sake of clarity of illustration, not all components of the cooling apparatus 400 are labelled in FIG. 4B. The operation of the cooling apparatus 400 may be similar in some respects to the operation of cooling apparatus 300 in FIG. 3B, and therefore may be best understood with reference thereto where like numerals designate like components not described again in detail.

As illustrated in FIG. 4B, relatively cooler fluid from the external heat dissipating device may enter the pumping units 102 via the respective inlets 148-1 and 148-2, as indicated by the arrows A. The cooler fluid may enter the cooling unit 302 and contacts the arrays of fins 124-1 and 124-2, as indicated by the arrows B. Inside the cooling unit 302, heat from the base plate 304 and the fins 124 is transferred to the cooler fluid and the temperature of the cooler fluid increases.

Unlike in the operation of the cooling apparatus 300, the heated fluid from the arrays of fins 124 does not mix with each other. As indicated by arrow C1, heated fluid from the array of fins 124-1 is prevented from flowing to the array of fins 124-2 due to the recess 407-1. Similarly, as indicated by arrow C2, the heated fluid from the array of fins 124-2 is prevented from flowing to the array of fins 124-1 due to the recess 407-2. The heated fluid may then enter the pumping units 102, as indicted by arrows D, and may exit the corresponding pumping units 102 via the outlets 147-1 and 147-2, as indicated by the arrows E. The heated fluid then flows to the external heat dissipating device(s) that cool the fluid using a cooling device, such as a fan. The cooler fluid is then provided to the inlets 148-1 and 148-2 for recirculation into the cooling unit 302.

Thus, in the cooling apparatus 400, fluid enters and exits from the same pumping unit 102. There is no exchange of fluid between the pumping units 102. In the embodiment in FIG. 4B, the pumping units 102-1 and 102-2 are referred to as operating in parallel. In such a configuration, each pumping unit 102 may operate at a different operating speed. Because each pumping unit 102 operates individually, the configuration (e.g., flow resistance, etc.) of the heat exchange chambers of each pumping unit 102 may be different. In an embodiment, sensors may monitor the operating conditions of each pumping unit 102 and, may communicate information regarding the operating conditions of each pumping unit 102 to a controller. Based on the information, the controller may vary the operation of the pumping units 102 so that both pumping units 102 have the same heat dissipating efficiency. For instance, the controller may vary the operating speed of one or more pumping units 102. The cooling apparatus 400 also may be used for cooling relatively large size integrated circuits (ICs) or other large heat generating devices.

Figure 5A:
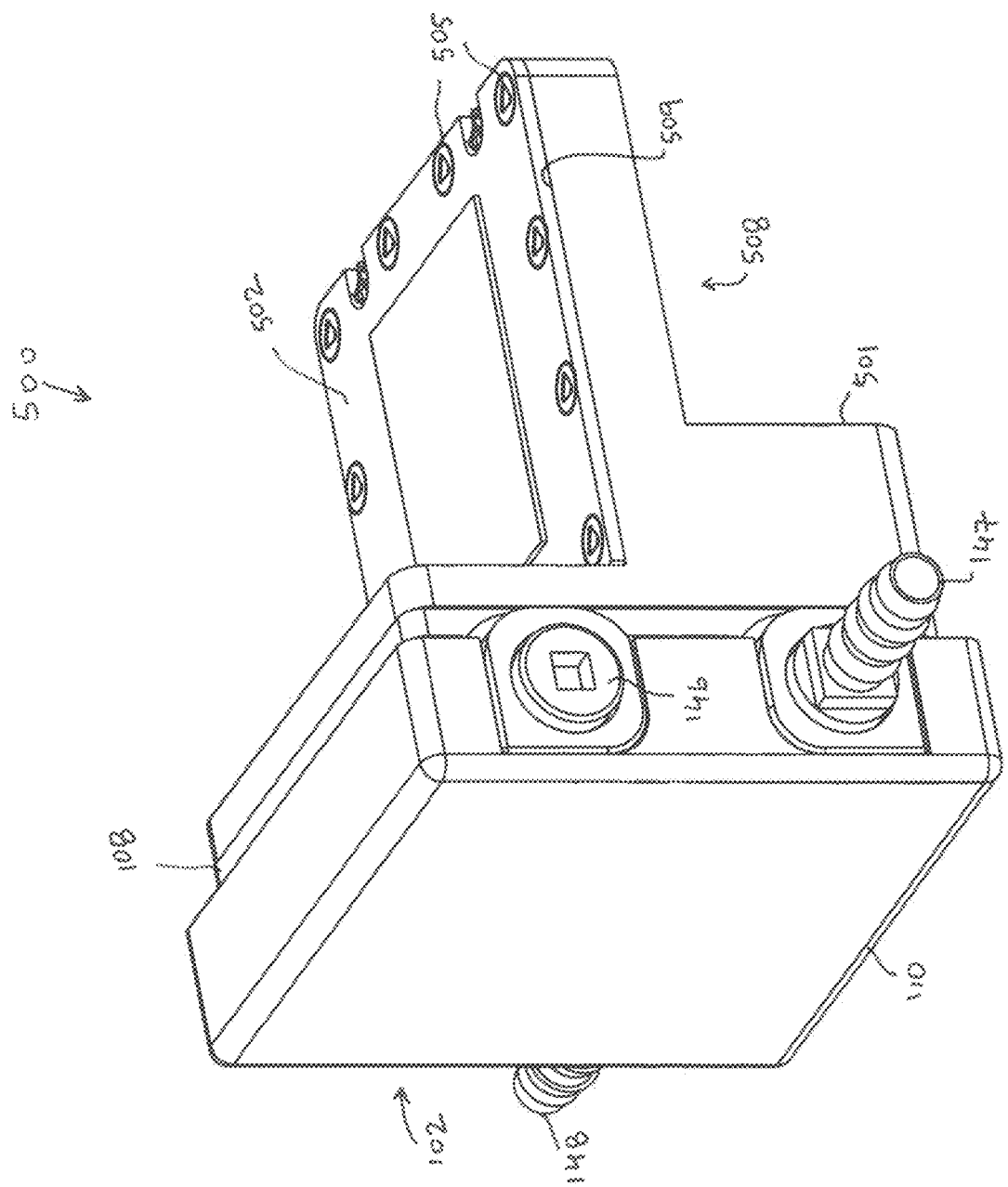
FIG. 5A is a perspective view of still another embodiment of a cooling apparatus.
Figure 5C:
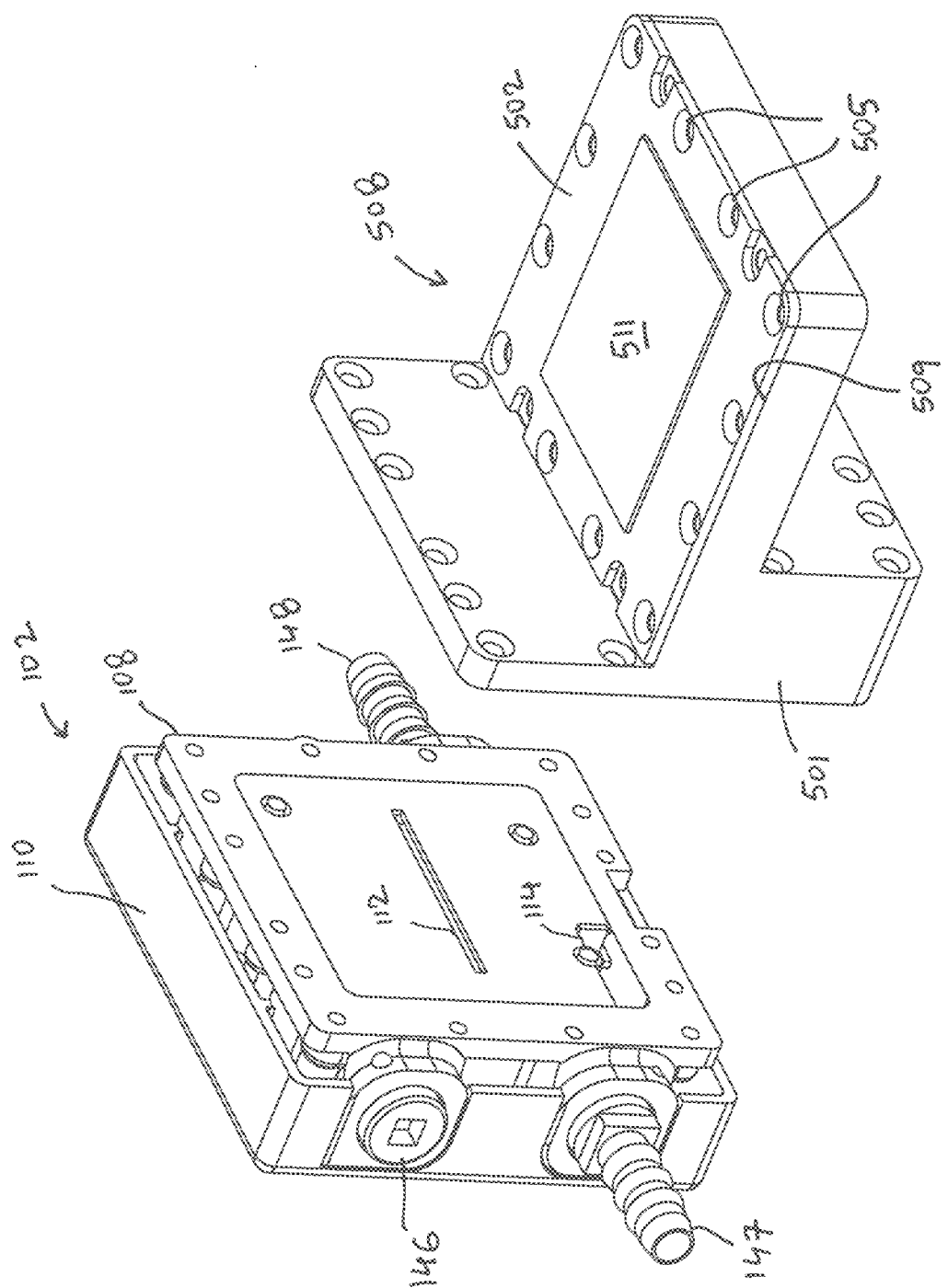

FIG. 5A is a perspective view of another embodiment of a cooling apparatus 500. The cooling apparatus 500 may be similar in some respects to the cooling apparatus 100 in FIG. 1A, and therefore may be best understood with reference thereto where like numerals designate like components not described again in detail. In the assembled state of the cooling apparatus 500 illustrated in FIG. 5A, the pumping unit 102 may be vertically oriented as opposed to a horizontal orientation in the cooling apparatus 100. FIGS. 5B and 5C are different perspective views of the cooling apparatus 500 in a disassembled state.

Referring to FIGS. 5A-5C, the cooling apparatus 500 may include a cooling unit 508 coupled to the pumping unit 102. The cooling unit 508 may have a generally T-shaped body 501 having a first or "vertical" surface 513 and a second or "horizontal" surface 509 perpendicular to the first surface 513. As illustrated in FIG. 5A, the pumping unit 102 may be coupled to the cooling unit 508 via the first surface 513. The cooling unit 508 and the pumping unit 102 are secured to each other using fastening techniques discussed above. The cooling unit 508 may be sized or otherwise configured to receive (or alternatively provide a housing for) a heat sink device 502 that functions as a heat sink to remove heat from an electronic component (e.g., a central processing unit (CPU)) or other heat generating sources coupled thereto. The electronic component or any other heat generating sources may be coupled on the surface 511 of the heat sink device 502 located generally above the fins 124. A heat generating source may be coupled to the surface 511 using a thermally conductive material (e.g., thermal grease) in order to transfer the heat generated from the heat generating source to fins via the base plate 516.

Figure 5D:
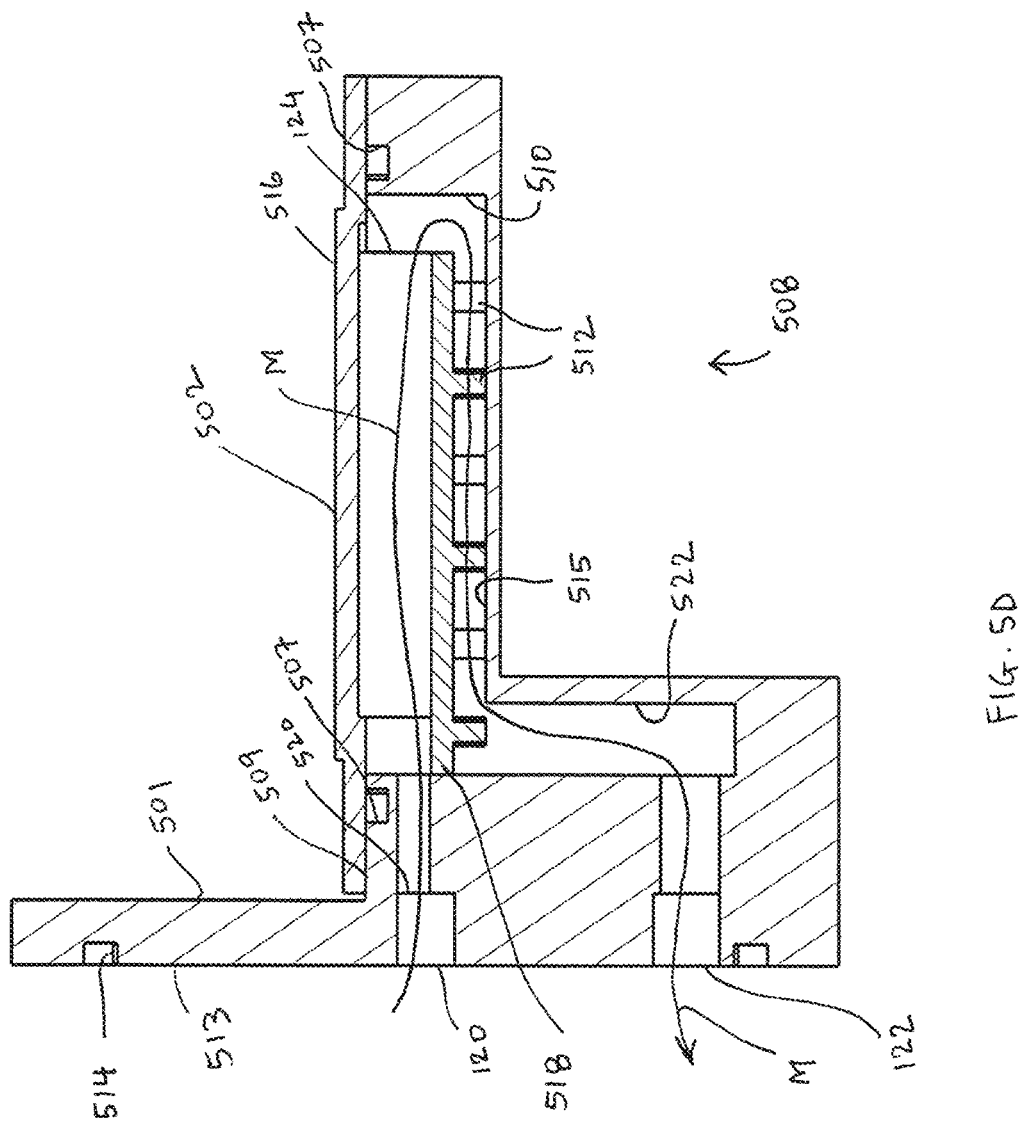
FIG. 5D is a cross-sectional view of the cooling apparatus of FIG. 5B taken along the line 5D-5D.
Figure 5E:
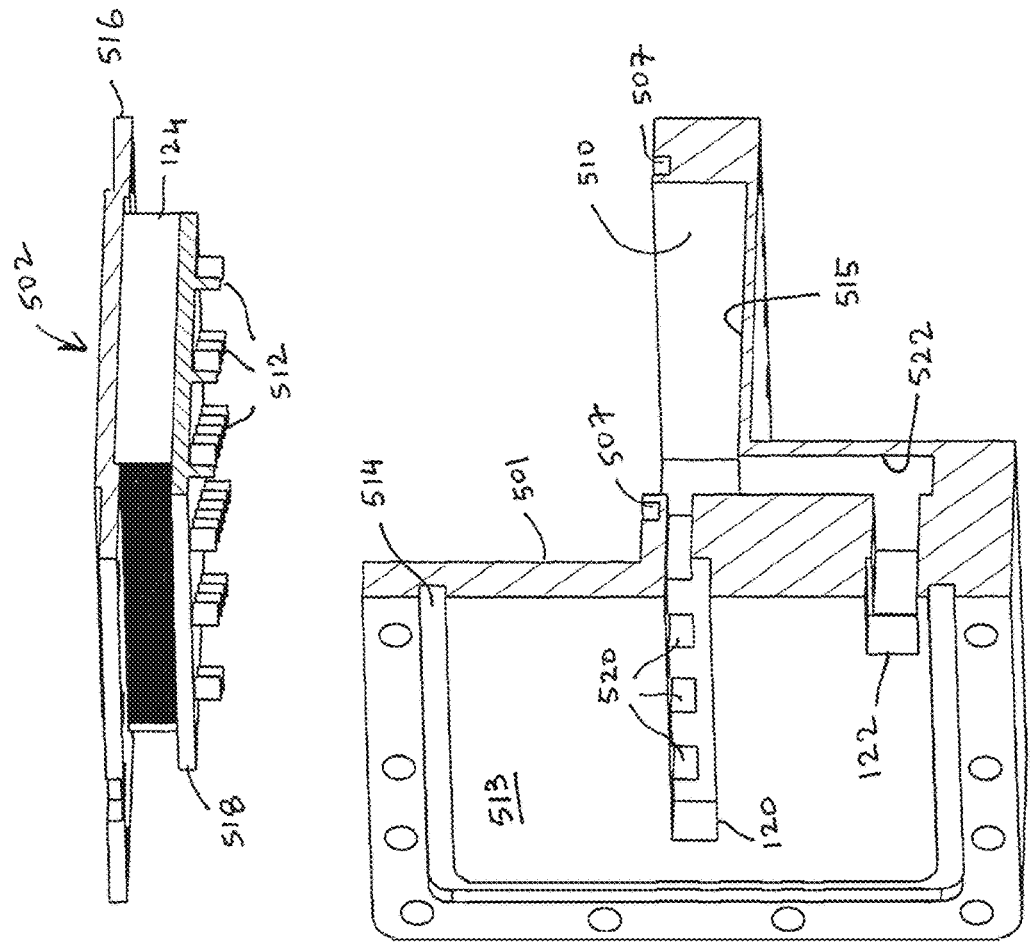
FIG. 5E is a perspective cross-sectional view of the cooling apparatus of FIG. 5B taken along the line 5D-5D.

Referring to FIG. 5B, the cooling unit 508 contains openings 120, 122 on the first surface 513 thereof. Referring to FIG. 5C, the pump housing 108 of the pumping unit 102 has openings 112, 114 that correspond to the openings 120, 122, similar to the cooling apparatus 100. FIG. 5D is a cross-sectional view of the cooling apparatus 500 taken along the line 5D-5D in FIG. 5B. FIG. 5E is a perspective cross-sectional view of the cooling apparatus 500 taken along the line 5D-5D in FIG. 5B and with the heat sink device 502 removed from the cooling unit 508. Referring to FIGS. 5D and 5E, the heat sink device 502 includes a base plate 516, a top plate 518, and the array of fins 124 disposed between the base plate 516 and the top plate 518. The body 501 of the cooling unit 508 may contain a cavity 510 in the second surface 509 that is sized or otherwise configured to receive the heat sink device 502. The heat sink device 502 also includes columns or pillars 512 extending from the top plate 518. The columns 512 support the heat sink device 502 by contacting a bottom surface 515 of the cavity 510 when the heat sink device 502 is installed in the cooling unit 508. When installed, body 501 may function similar to a cover that encloses the fins 124 that extend perpendicular to the first surface 513 of the cooling unit 508. Stated otherwise, the fins 124 and the openings 120, 122 may extend to be perpendicular to each other.

The body 501 may contain a plurality of channels 520 near the openings 120. The channels 520 fluidly connect the opening 120 with the cavity 510. The body 501 may also contain a passage 522 extending from the cavity 510 (or more specifically, from the bottom surface 515 thereof) to the opening 122 and thereby fluidly connecting the cavity 510 to the opening 122.

Referring to FIGS. 5A-5E, the heat sink device 502 may contain installation holes 505 and the cooling unit 508 may have installation holes 507 corresponding to the installation holes 505. The installation holes 505, 507 may receive fasteners, such as rivets, screws, nuts, bolts, etc. to secure the heat sink device 502 to the cooling unit 508. Additionally or alternatively, other fastening techniques, such as riveting, screwing, press-fitting, and the like, may be used to secure the heat sink device 502 to the cooling unit 508. As discussed above with reference to cooling apparatuses 100, 300, and 400, in the cooling apparatus 500, the pumping unit 102 and the cooling unit 508 may also be coupled to each other via a sealing element (similar to the sealing element 106) disposed between the pumping unit 102 and the cooling unit 508. The sealing element may be disposed in a recess 514 defined in the surface 513. For the sake of clarity of illustration, the sealing element is not illustrated in FIGS. 5B and 5C.

Figure 5F:
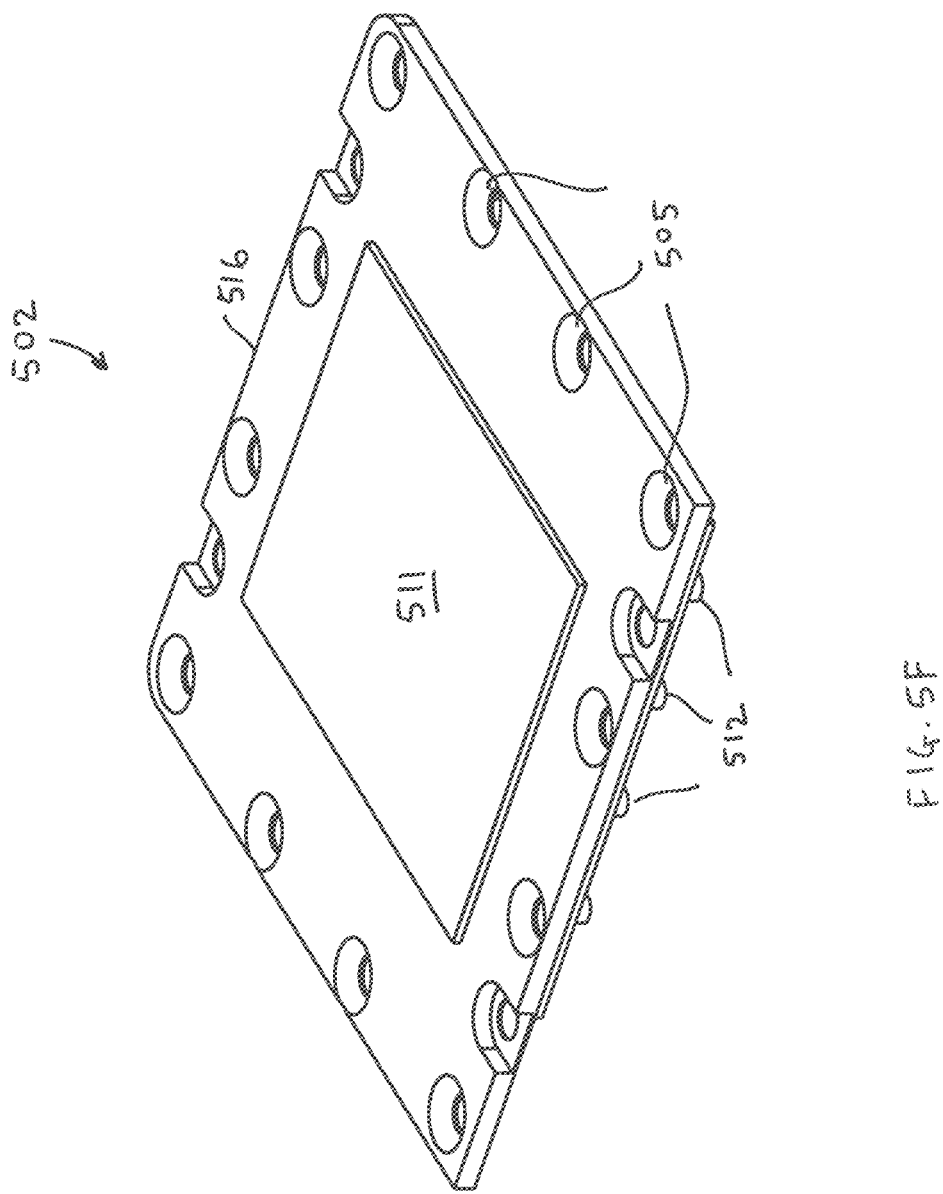
FIGS. 5F and 5G are top and bottom perspective views illustrating features of the heat sink device of the cooling apparatus of FIGS. 5A-5E, according to disclosed embodiments
Figure 5G:
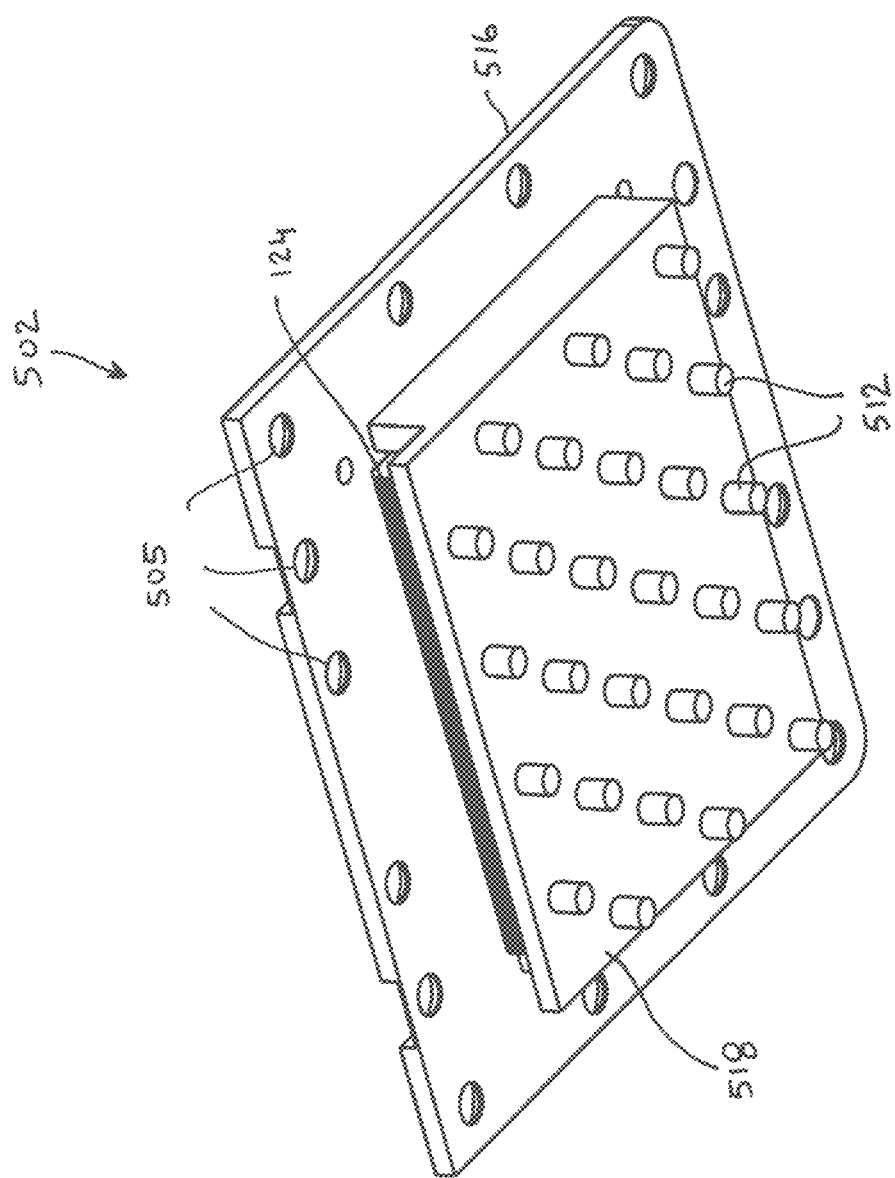

FIGS. 5F and 5G are top and bottom perspective views illustrating features of the heat sink device 502, according to embodiments disclosed herein.

Referring to FIGS. 5A-5D, during operation, relatively cooler fluid from the external heat dissipating device (e.g., a radiator or similar device) may enter the pumping unit 102 via the inlet 148. The cooler fluid may then enter the cooling unit 508 via the opening 120. The fluid may flow through the channels 520 and into the cavity 510. In the cavity 510, the heat from the base plate 516 and the fins 124 is transferred to the cooler fluid and the temperature of the cooler fluid increases.

The heated fluid then flows from underneath the fins 124, through the columns 512, and into the passage 522. The heated fluid may then exit the cooling unit 508 via the opening 122 and enter the pumping unit 102 via the opening 114. The heated fluid then may exit the pumping unit 102 via the outlet 147. The heated fluid flows to an external heat dissipating device(s) that cools the fluid using a cooling device, such as a fan. The cooler fluid is then provided to the inlet 148 for recirculation. The flow path of the fluid into and out of the cooling unit 508 is indicted by the arrow M in FIG. 5D. As seen, the flow path is generally U-shaped. The cooling apparatus 500 provides space savings that can be used in a space restricted environment.

Figure 6A:
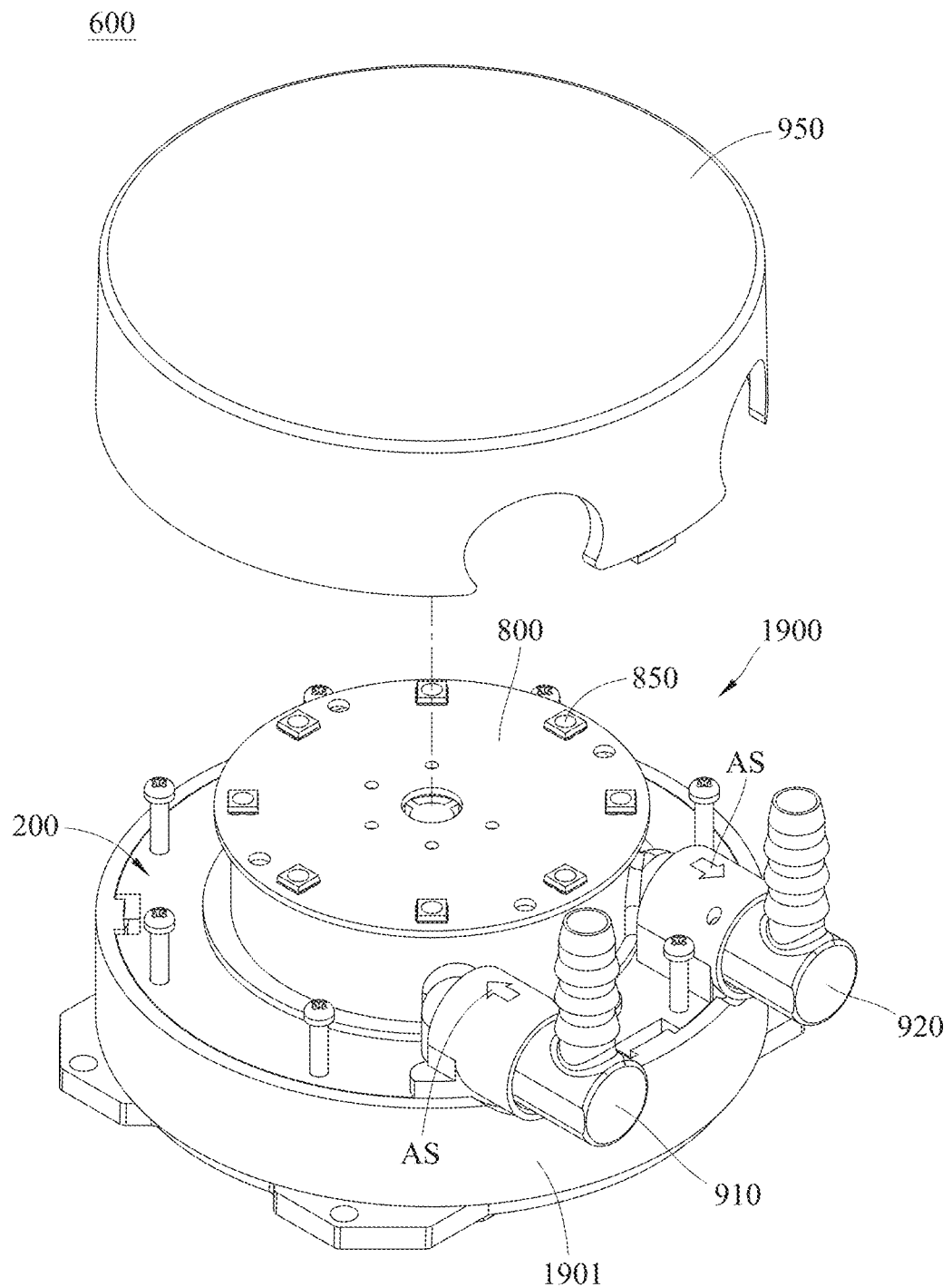
FIG. 6A is a partially exploded view of a cooling apparatus, according to embodiments of the disclosure.
Figure 6B:
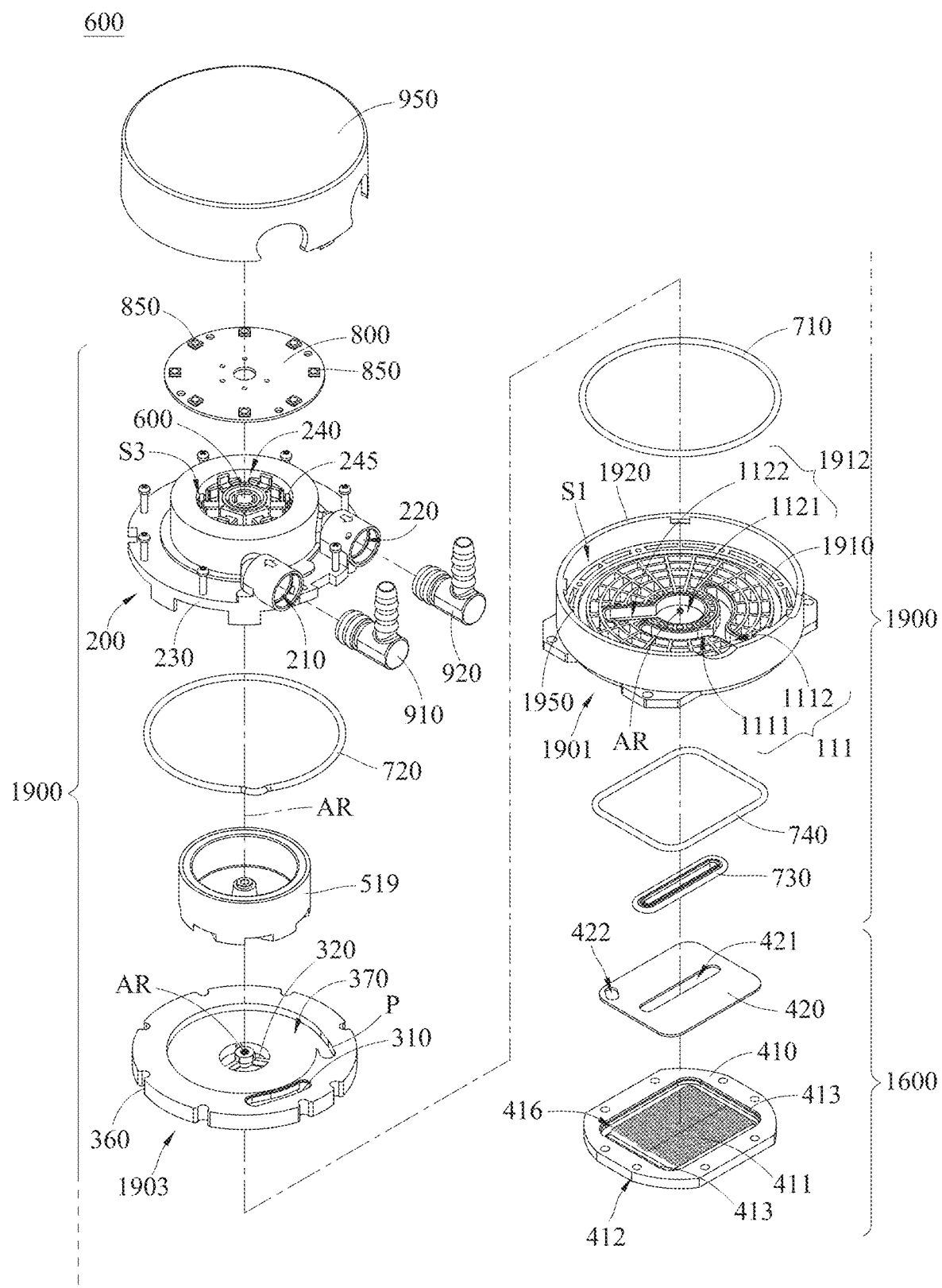
FIG. 6B is an exploded view of the cooling apparatus of FIG. 6A, according to embodiments of the disclosure.
Figure 6C:
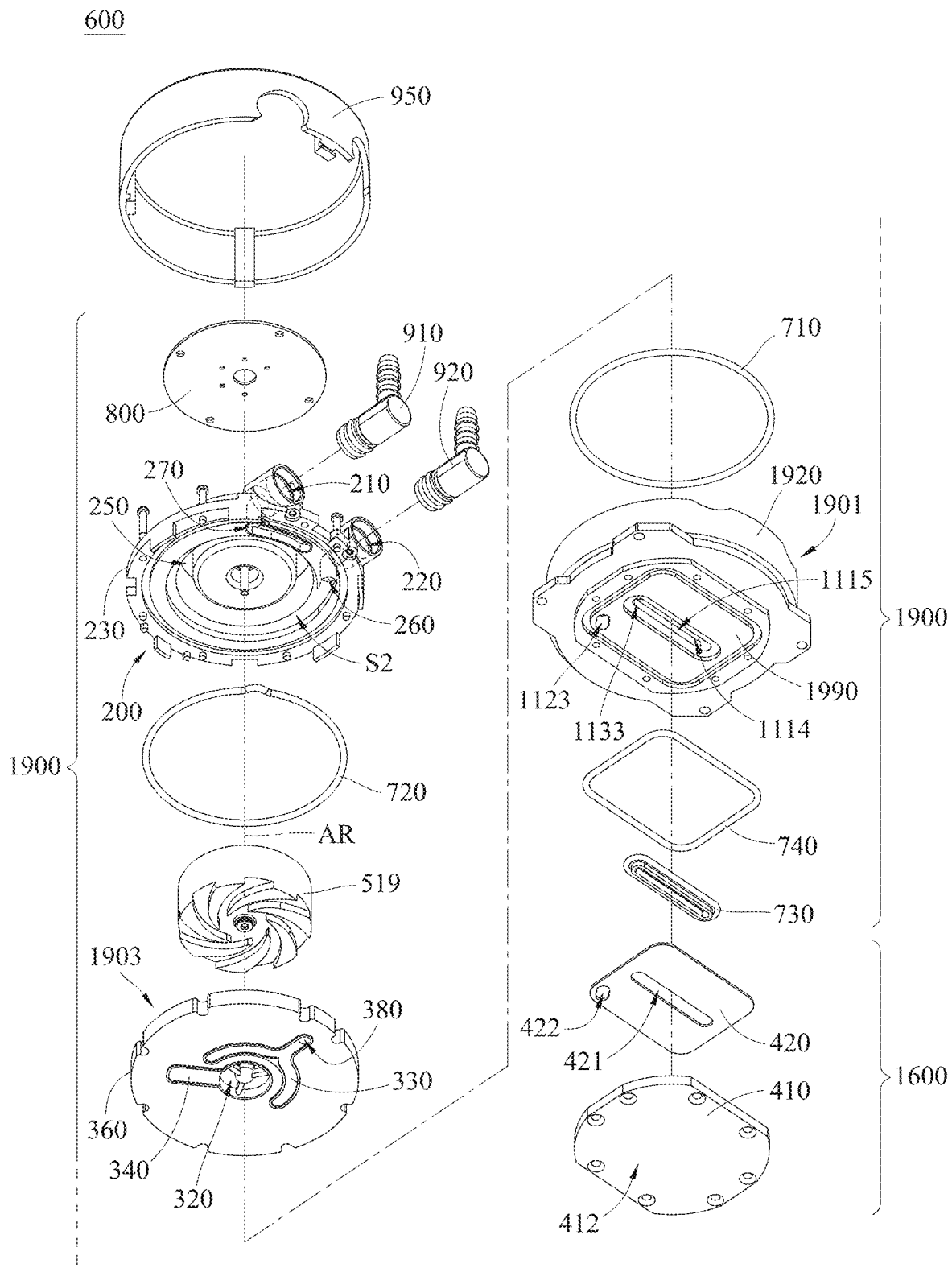
FIG. 6C is another exploded view of the cooling apparatus of FIG. 6A, according to embodiments of the disclosure.

FIG. 6A is a partially exploded view of a cooling apparatus 600, according to embodiments of the disclosure. FIG. 6B is an exploded view of the cooling apparatus 600 of FIG. 6A as viewed from the top, according to embodiments of the disclosure. FIG. 6C is an exploded view of the cooling apparatus 600 of FIG. 1A as viewed from the bottom, according to embodiments of the disclosure. As illustrated, the cooling apparatus 600 includes a casing 950, a pumping unit 1900, and a heat exchange unit 1600. The casing 950 is positioned on the pumping unit 1900 and the pumping unit 1900 is disposed on the heat exchange unit 1600. The casing 950 may be sized or otherwise configured to receive the pumping unit 1900 therein. The pumping unit 1900 includes an inlet 210 via which fluid enters the pumping unit 1900 and an outlet 220 via which the fluid exits the pumping unit 1900. The pumping unit 1900 includes an inlet connector 910 and an outlet connector 920. The inlet connector 910 and the outlet connector 920 are fluidly coupled to inlet 210 and the outlet 220, respectively.

The casing 950, the pumping unit 1900, and the heat exchange unit 1600 are generally cylindrical in shape. The casing 950 includes installation holes disposed along inner sidewalls thereof and the pumping unit 1900 includes installation holes corresponding to the installation holes of the casing 950 disposed at periphery edges thereof. The pumping unit 1900 contains installation holes at periphery edges thereof opposite the installation holes corresponding to the casing 950 installation holes and the heat exchange unit 1600 may have installation holes corresponding to the installation holes of the pumping unit 1900. The pumping unit 1900 installation holes receives fasteners (e.g., rivets, screws, bolts, clips, etc.) to secure the casing 950 thereto and the heat exchange unit 1600 receives fasteners (e.g., screws, bolts, clips, etc.) to secure the pumping unit 1900 thereto. The heat exchange unit 1600 is in fluid communication with the pumping unit 1900.

As illustrated in FIG. 6A, the pumping unit 1900 includes a housing 1901, a body 200, a rotor cover plate 1903, and a motor control circuit 800. The motor control circuit 800 includes at least one light source 850 (e.g., a light-emitting diode). The motor control circuit 800 is a generally flat annular disk-shaped circuit board (e.g., printed circuit board (PCB)) that is disposed on the body 200. The at least one light source 850 is disposed along a perimeter of the flat annular disk-shaped surface of the motor control circuit 800 and on a surface of the motor control circuit 800 that is opposite (faces away) the body 200. The at least one light source 850 is generally rectangular shaped. However, other shapes and sizes are within the scope of the disclosure. The motor control circuit 800 controls the at least one light source 850 and to illuminate arrow shapes AS on exterior portions of the inlet 210 and the outlet 220, and to decoratively illuminate the casing 950. The motor control circuit 800 controls the cooling apparatus 600 and is used to circulate fluid within the heat exchange unit 1600 for cooling heat generating sources (e.g., CPU, GPU) attached thereto.

The body 200 of the pumping unit 1900 includes the inlet 210, the outlet 220, a transition flow path indentation 270 (FIG. 6C), an outlet flow path 260 (FIG. 6C), a pump cover assembly 230 (FIG. 6B), a stator receiving portion 240 (FIG. 6B), and a rotor receiving portion 250 (FIG. 6B). The stator receiving portion 240 may be generally donut-shaped (or toroid shaped) and define a third cavity S3 that is sized and shaped (or otherwise configured) to receive a stator portion 245 therein. A top of the stator receiving portion 240 may be generally planar shaped (e.g., circular or cylindrical shaped) and the motor control circuit 800 is disposed on the top of the stator receiving portion 240 and electrically connected to the stator portion 245. Referring to FIG. 1B, the stator receiving portion 240 is disposed on top of the pump cover assembly 230 and the rotor receiving portion 250. The stator portion 245 is received in the third cavity S3 of the stator receiving portion 240 from a first or top side of the body 200. The rotor receiving portion 250 is generally donut-shaped (or toroid shaped) and at least partially defines a second cavity S2 that is sized and shaped (or otherwise configured) to receive a rotor portion 519. The rotor portion 519 defines an axis of rotation AR and includes a plurality of blades. The plurality of blades impart motion to the working fluid in the cooling apparatus 600, rotating around the axis of rotation AR. The plurality of blades extends from the flat circular surface of the rotor portion 519 and are generally curved. The rotor portion 519 is received in the second cavity S2 of the rotor receiving portion 250 from a second or bottom side of the body 200. The inlet 210 and the outlet 220 are both disposed along a same curved side of the pump cover assembly 230 and the stator receiving portion 240. The inlet 210 and outlet 220 may generally be cylindrical-shaped and are sized and shaped (or otherwise configured) to receive fittings or the like to exchange fluid between an external heat dissipating device (e.g., CPU. GPU) in fluid communication with the cooling apparatus 600. The transition flow path indentation 270 is located at or adjacent the inlet 210. The transition flow path indentation 270 is shaped generally as an elongated indentation with an end at the inlet 210 and another end extending adjacent the inlet 210. The outlet flow path 260 is located at the outlet 220. The outlet flow path 260 is shaped generally as a cylinder with an end at the outlet 220 and another end extending transversally adjacent the outlet 220.

The rotor cover plate 1903 includes a cover plate body 360, a fifth opening 320, a transition flow path 310, and a fourth opening 380. The cover plate body 360 is generally disk shaped and an inner portion (radially distanced from the outer edges) thereof is indented or depressed to form a rotor blade receiving portion 370. A wishbone-shaped indentation 1930 and a lollipop-shaped indentation 340 are formed on a bottom, outer surface of the cover plate body 360 opposite the rotor blade receiving portion 370. The rotor cover plate 1903 is disposed on the pump cover assembly 230, and covers the second cavity S2, transition flow path indentation 270, and outlet flow path 260.

The rotor blade receiving portion 370 is a generally flat annular nautilus-shaped indentation that is sized and shaped (or otherwise configured) to receive a plurality of blades of the rotor portion 519 therein. The fifth opening 320 is located along the axis of rotation AR and is shaped generally as a circular opening, forming a lollipop portion of the lollipop-shaped indentation 340 on the outer surface. A stick portion of the lollipop-shaped indentation 340 on the outer surface generally protrudes outwardly from the lollipop portion of the lollipop-shaped indentation 340, angled away from the same curved side of the inlet 210 and the outlet 220 when installed. The generally outwardly protruding stick portion is not limited to any specific type of shape and any suitable shape may be used without departing from the scope of the disclosure.

The transition flow path 310 is located along a periphery of the rotor cover plate 1903 and is shaped generally as an elongated slot. The transition flow path 310 is sized and shaped (or otherwise configured) similar to the transition flow path indentation 270 and is at or adjacent the inlet 210 when installed, with an end at the inlet 210 and another end extending adjacent the inlet 210. The fourth opening 380 is disposed at the another end extending adjacent the inlet 210, forming an end portion of the wishbone-shaped indentation 1930 on the outer surface. The wishbone portion of the wishbone-shaped indentation 1930 partially surrounds the lollipop portion (or fifth opening 320) of the lollipop-shaped indentation 340, with one leg end of the wishbone portion proximate the protruding stick portion of the lollipop-shaped indentation 340 and another leg end of the wishbone portion on an opposing side of the lollipop portion (or fifth opening 320) of the lollipop-shaped indentation 340. The end portion of the wishbone-shaped indentation 1930 is generally an end portion of an elongated indention centrally disposed between the two leg ends of the wishbone portion, protruding outwardly between the inlet 210 and outlet 220 when installed. The transition flow path 310 and the transition flow path indentation 270 form a single flow path in liquid communication with the inlet 210 and a wishbone-shaped flow path 111 (see also FIG. 9).

A protruding end P of the nautilus-shaped indentation of the rotor blade receiving portion 370 is located along a same curved side of the cover plate body 360 as the transition flow path 310 and is shaped generally as a semi-circular protrusion. The semi-circular protrusion B is sized and shaped (or otherwise configured) to receive fluid from the another extended end of the outlet flow path 260 when installed. The semi-circular protrusion B and the outlet flow path 260 form a single flow path in fluid communication with the outlet 220 and the second cavity S2. The fifth opening 320 is in fluid communication with the second cavity S2 and the heat exchange unit 1600 via a lollipop-shaped flow path 1912 (see also FIG. 7). When installed, the rotor cover plate 1903 covers the second cavity S2, transition flow path indentation 270, and outlet flow path 260 of the pumping unit 1900.

As illustrated in FIGS. 6B and 6C, the housing 1901 of the pumping unit 1900 includes a bottom inner surface 1910, an inner annular side wall 1920 disposed along a perimeter of the bottom inner surface 1910, a bottom outer surface 1990 opposite the bottom inner surface 1910, a third opening 1123, a first end opening 1113, and a second end opening 1114. The inner annular side wall 1920 and the bottom inner surface 1910 define a generally circular or cylindrical first cavity S1. The first cavity S1 may be sized and shaped (or otherwise configured) to receive (at least partially) the body 200 disposed on the rotor cover plate 1903 therein. The inner annular side wall 1920 and the bottom inner surface 1910 may be integrally formed using manufacturing methods such as injection molding or the like. In other embodiments, the inner annular side wall 1920 and the bottom inner surface 1910 may be separately formed and then combined thereafter.

The bottom inner surface 1910 includes a generally mesh shaped support structure 1950 that is located in the first cavity S1 that extends transversely from the bottom inner surface 1910. The support structure 1950 is a generally flat raised annular disk-shaped structure and sized and shaped (or otherwise configured) to encompass the bottom inner surface 1910. The support structure 1950 supports the body 200 disposed on the rotor cover plate 1903 by contacting the outer surface of the cover plate body 360 when the body 200 disposed on the rotor cover plate 1903 is installed in the housing 1901. The support structure 1950 includes the lollipop-shaped flow path 1912, the wishbone-shaped flow path 111, and perimeter installation holes. The perimeter installation holes are disposed on a perimeter of the support structure 1950 proximate the inner annular side wall 1920 and may be cylindrical shaped and may align the body 200 by fastening of the pump cover assembly 230 when the body 200 disposed on the rotor cover plate 1903 is installed in the housing 1901. The perimeter installation holes of the support structure 1950 receive fasteners, such as rivets, screws, bolts, etc. to secure the body 200 disposed on the rotor cover plate 1903 to the housing 1901. A lollipop portion 1121 of the lollipop-shaped flow path 1912 is located along the axis of rotation AR and is shaped generally as a circular reservoir. A stick portion 1122 of the lollipop-shaped flow path 1912 is shaped generally as an elongated channel protruding outwardly from the lollipop portion 1121 of the lollipop-shaped flow path 1912, angled away from the same curved side of the inlet 210 and the outlet 220 when installed. The generally outwardly protruding stick portion 1122 is not limited to any specific type of shape and any suitable shape may be used without departing from the scope of the disclosure.

The third opening 1123 is shaped generally as a circular opening disposed on an end of the stick portion 1122 opposite the lollipop portion 1121. The end of the stick portion 1122 opposite the lollipop portion 1121 is closer to the inner annular side wall 1920 than the axis of rotation AR. The lollipop-shaped flow path 1912 is sized and shaped (or otherwise configured) to mirror the lollipop-shaped indentation 340. The lollipop-shaped flow path 1912 and the lollipop-shaped indentation 340 form a single flow path in liquid communication with the second cavity S2 and the heat exchange unit 1600 via the third opening 1123. The wishbone portion 1111 of the wishbone-shaped flow path 111 is shaped generally as a wishbone-shaped channel partially surrounding the lollipop portion 1121 of the lollipop-shaped flow path 1912, with one leg end of the wishbone portion 1111 near to the protruding stick portion 1122 of the lollipop-shaped flow path 1912 and another leg end of the wishbone portion 1111 on an opposite side of the lollipop portion 1121 of the lollipop-shaped flow path 1912. The first end opening 1113 is shaped generally as a circular opening and disposed at the end of the leg end of the wishbone portion 1111 near to the protruding stick portion 1122 of the lollipop-shaped flow path 1912. The a second end opening 1114 is shaped generally as a circular opening and disposed at the end of the another leg end of the wishbone portion 1111 on an opposite side of the lollipop portion 1121 of the lollipop-shaped flow path 1912. The first end opening 1113 and the second end opening 1114 are located at opposite ends of a bottom housing indentation 1115 disposed on the bottom outer surface 1990.

The bottom housing indentation 1115 is generally an elongated indented channel centrally disposed on the bottom outer surface 1990 that is parallel to the inlet 210 and the outlet 220 when installed. A length of the bottom housing indentation 1115 may generally extend a distance from the inlet 210 to the outlet 220. The end portion of the wishbone-shaped flow path 111 is generally an end portion of an elongated channel 1112 centrally disposed between the two leg ends of the wishbone portion 1111, protruding outwardly between the inlet 210 and outlet 220 when installed. The wishbone-shaped flow path 111 is sized and shaped (or otherwise configured) to mirror the wishbone-shaped indentation 1930. The wishbone-shaped flow path 111 and the wishbone-shaped indentation 1930 form a single split flow path in liquid communication with the inlet 210 via the fourth opening 380 and transition flow path 310 and the heat exchange unit 1600 via the first end opening 1113, the another leg opening 1114, and the bottom housing indentation 1115.

When installed, the housing 1901 covers the fifth opening 320, lollipop-shaped indentation 340, transition flow path 310, and wishbone-shaped indentation 1930. The third opening 1123 is in fluid communication with the heat exchange unit 1600 and the outlet 220. The third opening 1123 is in fluid communication with the outlet 220 via the lollipop-shaped flow path 1912, the lollipop-shaped indentation 340, fifth opening 320, the second cavity S2, and the outlet flow path 260. The first end opening 1113, the second end opening 1114, and bottom housing indentation 1115 are in fluid communication with the heat exchange unit 1600 and the inlet 210. The first end opening 1113, the second end opening 1114, and the bottom housing indentation 1115 are in fluid communication with the inlet 210 via the wishbone-shaped flow path 111, the wishbone-shaped indentation 1930, the fourth opening 380, the transition flow path 310, and the transition flow path indentation 270. When installed, the body 200 covers to enclose the pumping unit 1900 to define the wishbone-shaped flow path 111 via the wishbone-shaped indentation 1930 and the lollipop-shaped flow path 1912 via the lollipop-shaped indentation 340.

As illustrated, the heat exchange unit 1600 includes a base plate 410, and a top plate 420. The base plate 410 may be generally oval in shape and include a base periphery surface 412 and a plurality of fins 411 disposed in a central portion of a top surface of the base plate 410 opposite the base periphery surface 412. The plurality of fins 411 may be arranged parallel to each other and extend transversely on the base periphery surface 412 of the base plate 410 along the length (or width) thereof. The base plate 410 may define recesses 413 adjacent and in fluid communication with the plurality of fins 411 and on opposite sides of the plurality of the fins. The recesses 413 may extend parallel to the plurality of fins 411. The top plate 420 is generally rectangular in shape and includes a second opening 422, and a first opening 421. The second opening 422 is generally oval shaped and disposed in a corner of the top plate 420. The first opening 421 is shaped generally as an elongated opening centrally disposed on the top plate 420 that is extending perpendicular to the plurality of fins 411 and parallel to the inlet 210 and the outlet 220 when installed.

The top plate 420 may be coupled to the base plate 410 and define a heat exchange chamber 416 disposed in a fourth cavity S4. The top plate 420 to the base plate 410 are coupled and secured to each other using welding, adhesion, press-fitting, screwing, for example. Other methods to couple and secure the top plate 420 to the base plate 410 can also be used without departing form the scope of the disclosure. When assembled, the second opening 422 coincides with the third opening 1123 and the first opening 421 coincides with the bottom housing indentation 1115. When installed, the pumping unit 1900 functions as a cover that encloses the heat exchange unit 1600 and defines the heat exchange chamber 416. The second opening 422 and the first opening 421 are in fluid communication with the heat exchange chamber 416. The second opening 422 is in fluid communication with the third opening 1123. The first opening 421 is in fluid communication with the bottom housing indentation 1115.

As illustrated in FIGS. 6B and 6C, sealing elements (e.g., gaskets, O-rings, and the like) are disposed in recesses to prevent working fluid from leaking out of the cooling apparatus 600. The recesses are sized and shaped (or otherwise configured) to receive the sealing elements therein. The second cavity S2 side of the pump cover assembly 230 includes a bottom periphery surface having a recess therein and the inner surface of the cover plate body 360 includes a top periphery surface having a recess therein, coinciding with the pump cover assembly 230 recess. A fourth sealing element 720 is disposed between the bottom periphery surface of the pump cover assembly 230 and the top periphery surface of the cover plate body 360 to limit fluid that flows within the pumping unit 1900 from leaking out of the cooling apparatus 600. The cover plate body 360 includes an outer periphery surface having a recess therein and the support structure 1950 includes a top periphery surface having a recess therein, coinciding with the cover plate body 360 recess. A third sealing element 710 is disposed between the outer periphery surface of the cover plate body 360 and the top periphery surface of the support structure 1950 to limit fluid that flows within the pumping unit 1900 from leaking out of the cooling apparatus 600. The bottom outer surface 1990 of the housing 1901 includes a periphery surface having a recess therein and a central surface having a recess therein. An inner surface of the base plate 410 of the heat exchange unit 1600 includes a periphery surface having a recess therein and a central surface having a recess therein, coinciding with the bottom outer surface 1990 recesses, respectively. A second sealing element 740 and a first sealing element 730, is disposed between the periphery surface of the bottom outer surface 1990 and periphery surface base plate 410, respectively to limit working fluid that flows within the pumping unit 1900 from leaking out of the cooling apparatus 600.

When assembled, cooler working fluid having heat dissipated therefrom using an external heat dissipating device (e.g., a CPU, GPU) may enter the transition flow path indentation 270 and the transition flow path 310 of the pumping unit 1900 via the inlet 210. Inside the transition flow path indentation 270 and the transition flow path 310, the cooler fluid may enter the wishbone-shaped indentation 1930 and the wishbone-shaped flow path 111 via the fourth opening 380. Inside the wishbone-shaped indentation 1930 and the wishbone-shaped flow path 111, the cooler fluid may enter the heat exchange chamber 416 via the first end opening 1113, the second end opening 1114, the bottom housing indentation 1115, and the first opening 421, and contact the plurality of fins 411. After the heat from the base plate 410 and the plurality of fins 411 is transferred to the cooler fluid and the temperature of the cooler fluid increases, the heated fluid from the plurality of fins 411, then flows through the second opening 422, the third opening 1123, the wishbone-shaped flow path 111 and the wishbone-shaped indentation 1930, and the fifth opening 320, and then enter the second cavity S2 of the pumping unit 1900 to contact the plurality of blades of the rotor portion 519. The heated fluid flows to the outlet flow path 260, and then exits the pumping unit 1900 via the outlet 220. The heated fluid then flows to the external heat dissipating device that cools the fluid using a cooling device, such as a radiator and/or one or more fans. The cooler fluid is then provided to the inlet 210 for recirculation into the heat exchange unit 1600.

Figure 7:
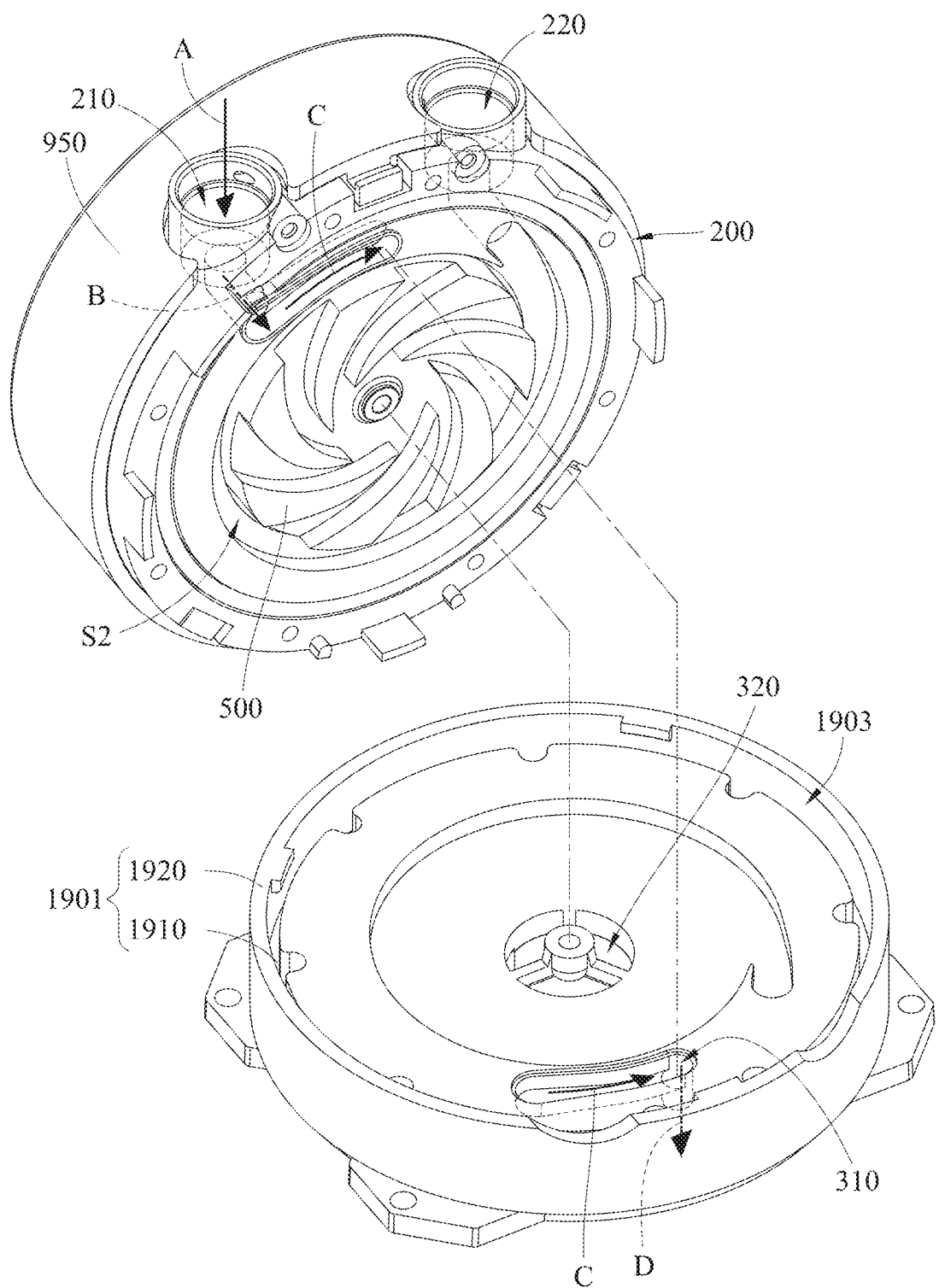
FIG. 7 is a perspective view of the cooling apparatus that illustrates fluid flow in the cooling apparatus during operation thereof, according to embodiments of the disclosure.

FIG. 7 is a perspective view of the cooling apparatus 600 that illustrates fluid flow in the cooling apparatus 600 during operation thereof, according to embodiments of the disclosure. As illustrated in FIG. 7, relatively cooler fluid from an external heat dissipating device enters the transition flow path indentation 270 and the transition flow path 310 of the pumping unit 1900 via the inlet 210, as indicated by the arrows A and B. Inside the transition flow path indentation 270 and the transition flow path 310, the cooler fluid enters the wishbone-shaped indentation 1930 and the wishbone-shaped flow path 111 via the fourth opening 380, as indicated by the arrows C, and D.

Figure 8:
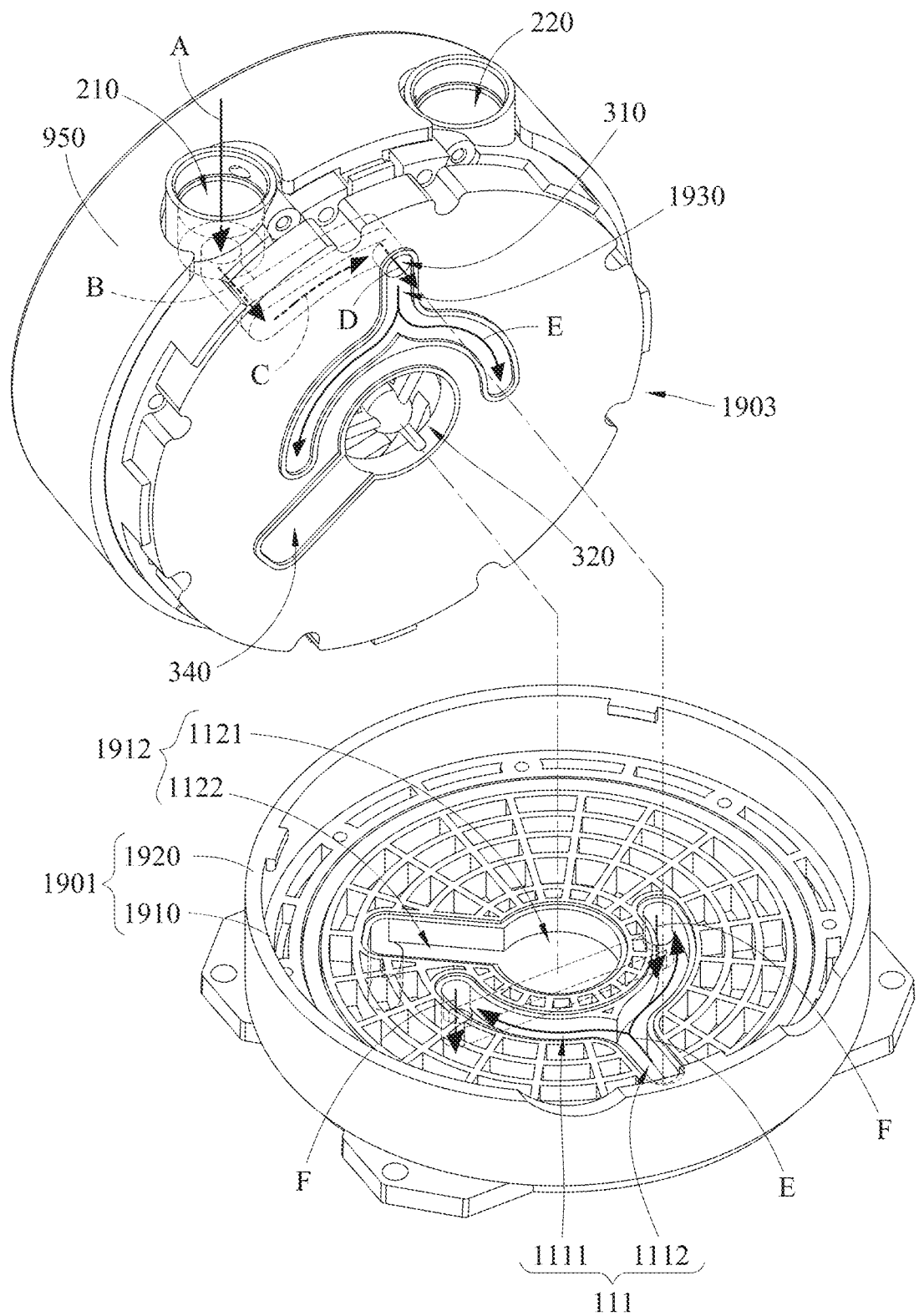
FIG. 8 is another perspective view of the cooling apparatus that illustrates fluid flow in the cooling apparatus during operation thereof, according to embodiments of the disclosure.

FIG. 8 is another perspective view of the cooling apparatus 600 that illustrates fluid flow in the cooling apparatus 600 during operation thereof, according to embodiments of the disclosure. As illustrated in FIG. 8, inside the wishbone-shaped indentation 1930 and the wishbone-shaped flow path 111, the cooler fluid enters the bottom housing indentation 1115 via the first end opening 1113 and the second end opening 1114, as indicated by the arrows E and F.

Figure 9:
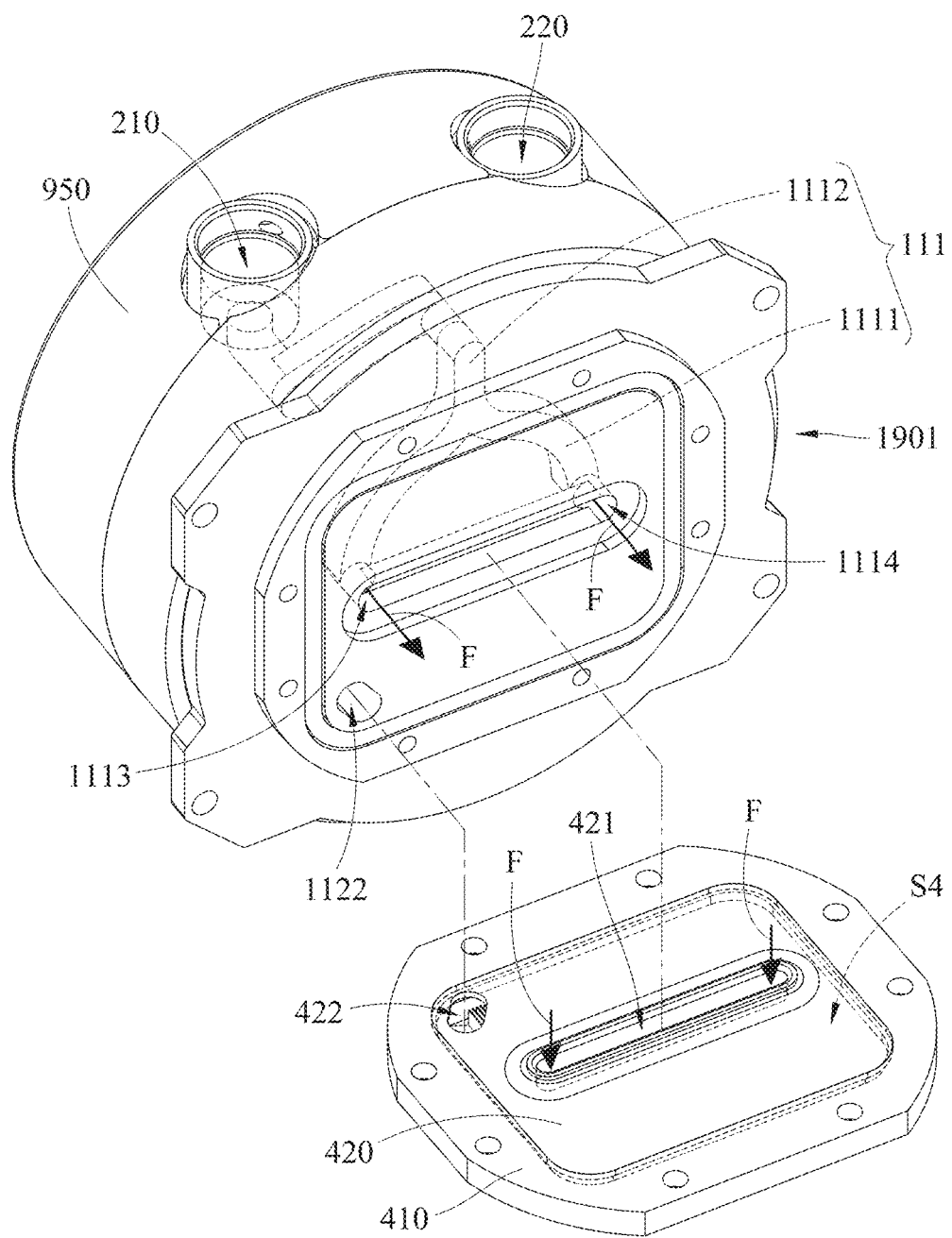
FIG. 9 is yet another perspective view of the cooling apparatus that illustrates fluid flow in the cooling apparatus during operation thereof, according to embodiments of the disclosure.

FIG. 9 is yet another perspective view of the cooling apparatus 600 that illustrates fluid flow in the cooling apparatus 600 during operation thereof, according to embodiments of the disclosure. As illustrated in FIG. 9, inside the bottom housing indentation 1115, the cooler fluid enters the heat exchange chamber 416 via the first opening 421, as indicated by the arrows E and F.

Figure 10:
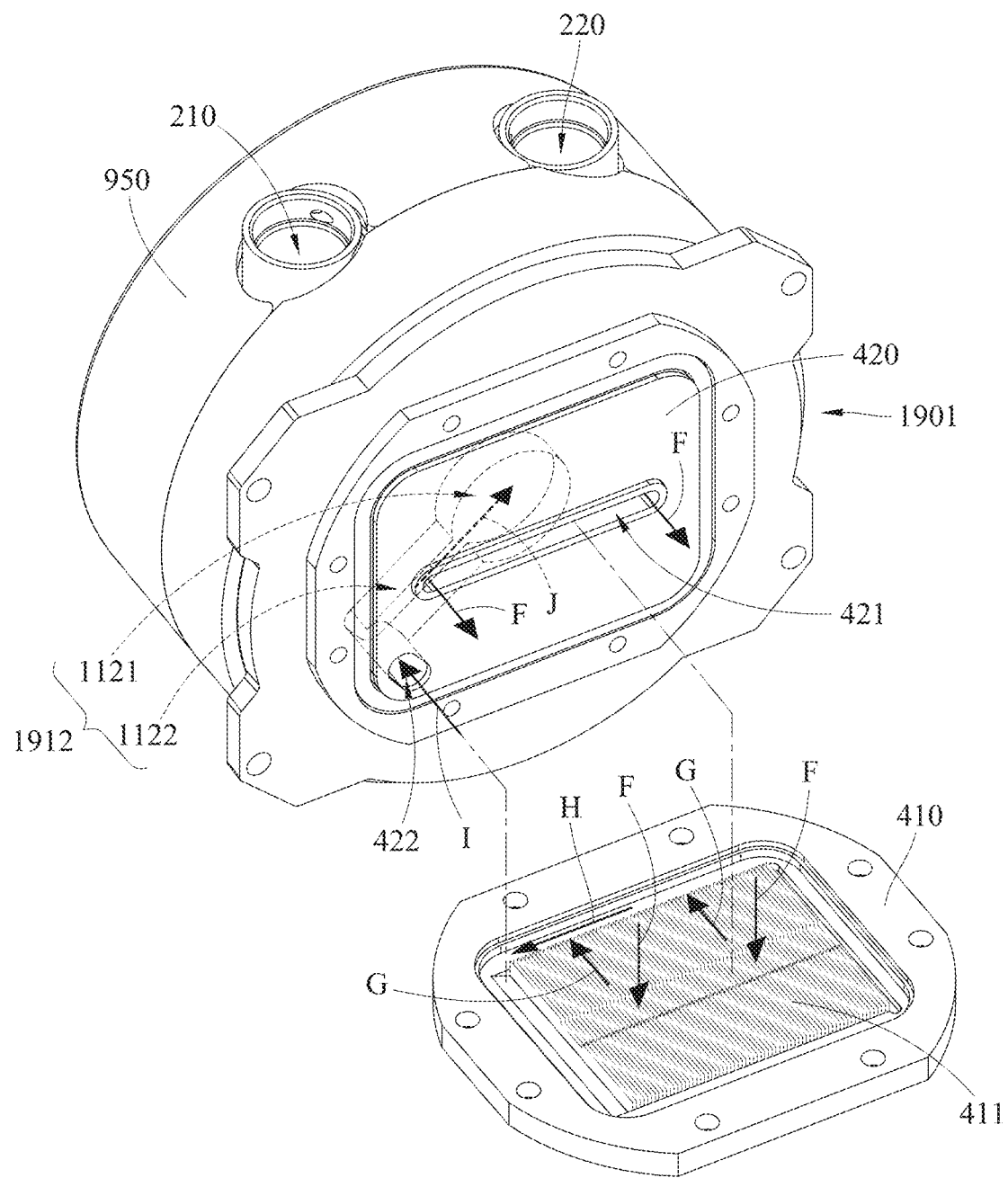
FIG. 10 is a perspective view of the cooling apparatus that illustrates fluid flow in the cooling apparatus during operation thereof, according to embodiments of the disclosure.

FIG. 10 is a perspective view of the cooling apparatus 600 that illustrates fluid flow in the cooling apparatus 600 during operation thereof, according to embodiments of the disclosure. As illustrated in FIG. 10, inside the heat exchange chamber 416, the cooler fluid initially flows over the plurality of fins 411, crossing transversely (e.g., perpendicularly) via the first end opening 1113 and the a second end opening 1114 through the bottom housing indentation 1115 and the first opening 421, generally, more efficiently dissipating heat from the entire area of the heat exchange chamber 416, as indicated by the arrows G and H. Inside the heat exchange unit 1600, heat from the base plate 410 and the plurality of fins 411 is transferred to the cooler fluid and the temperature of the cooler fluid increases.

Figure 11:
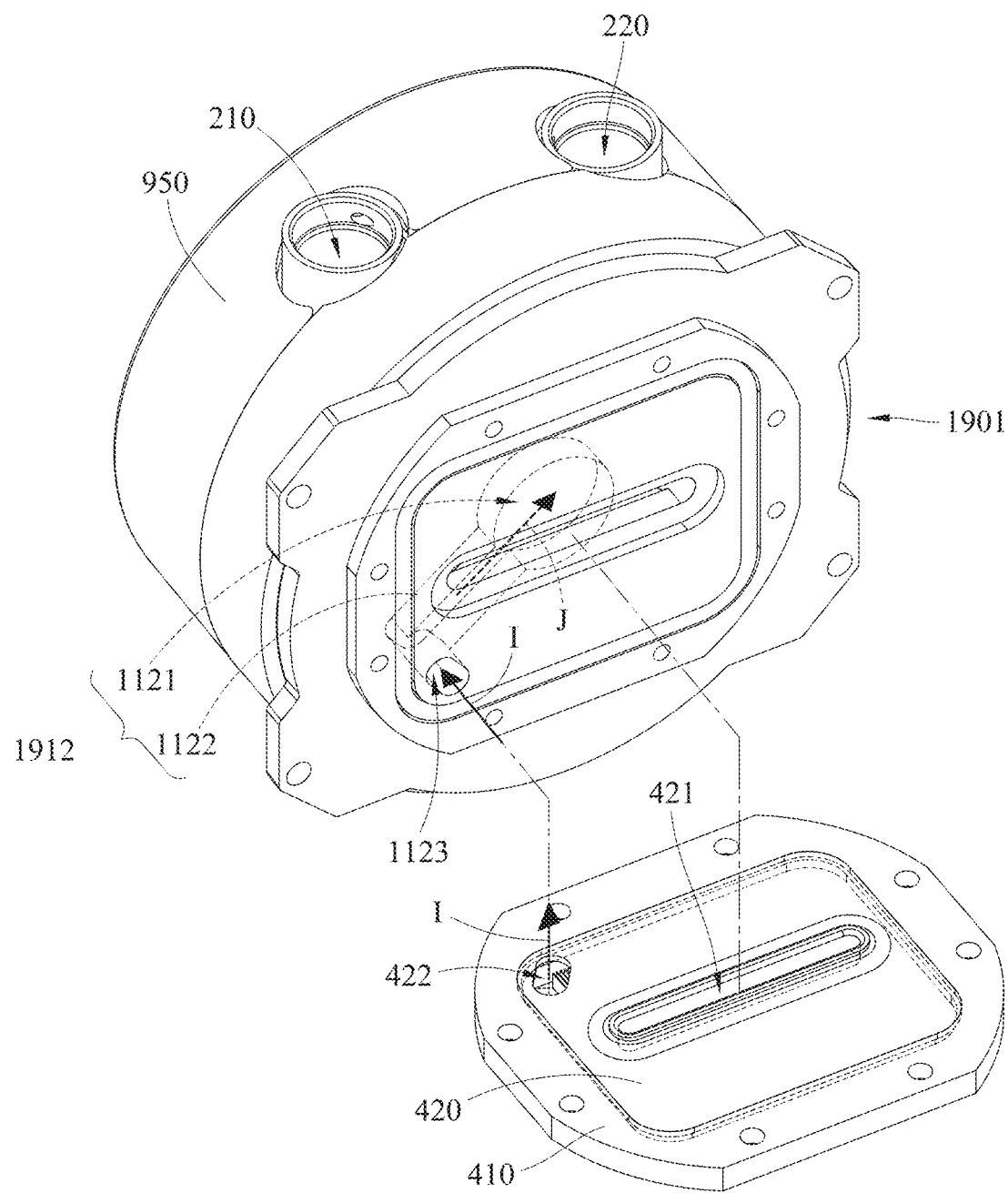
FIG. 11 is another perspective view of the cooling apparatus that illustrates fluid flow in the cooling apparatus 10 during operation thereof, according to embodiments of the disclosure.

FIG. 11 is another perspective view of the cooling apparatus 600 that illustrates fluid flow in the cooling apparatus 600 during operation thereof, according to embodiments of the disclosure. As illustrated in FIG. 11, inside the heat exchange chamber 416, heated fluid from the plurality of fins 411, may then flow to the lollipop-shaped flow path 1912 and the lollipop-shaped indentation 340 via the second opening 422 and the third opening 1123, as indicated by arrow I.

Figure 12:
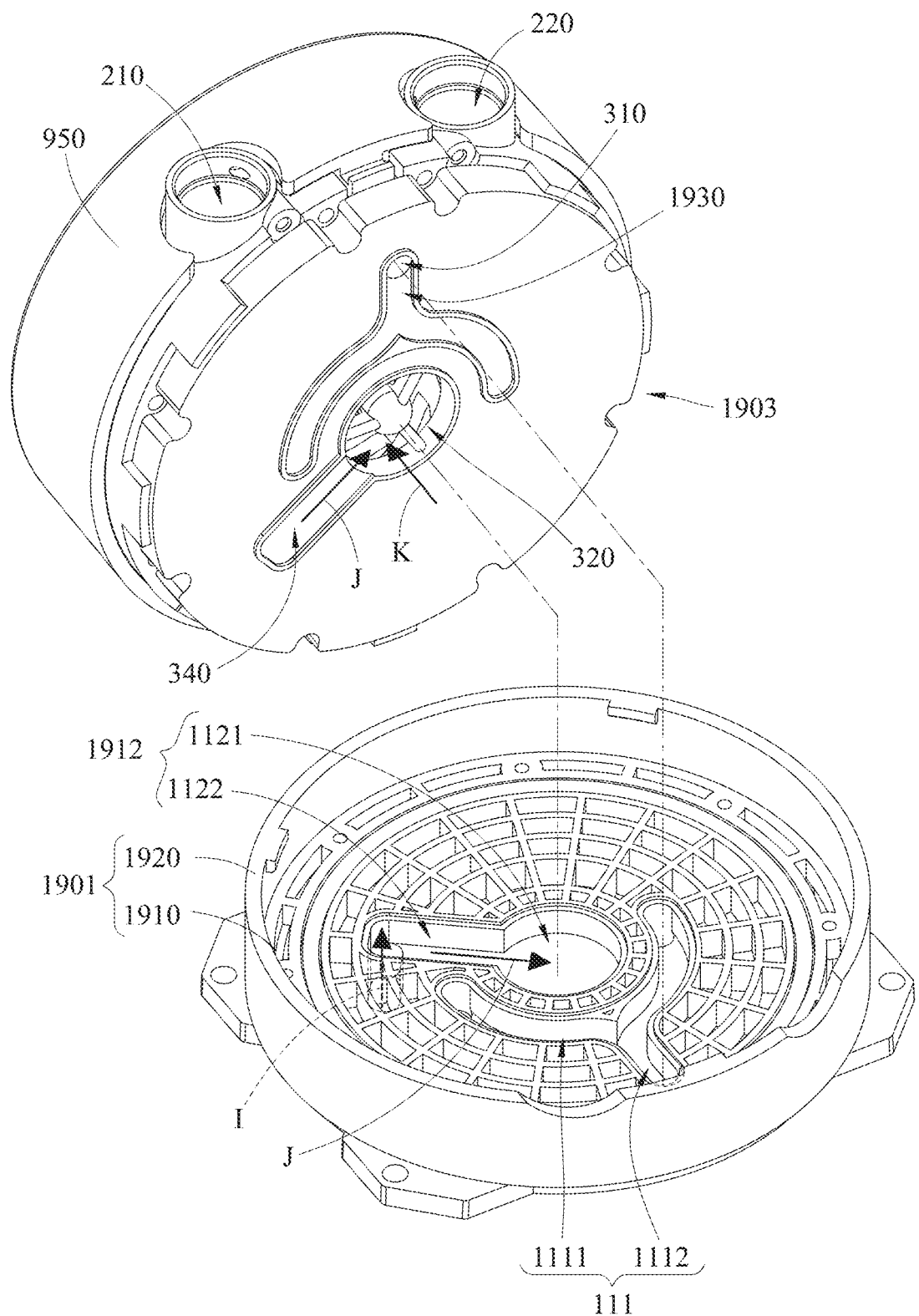
FIG. 12 is yet another perspective view of the cooling apparatus that illustrates fluid flow in the cooling apparatus during operation thereof, according to embodiments of the disclosure.

FIG. 12 is yet another perspective view of the cooling apparatus 600 that illustrates fluid flow in the cooling apparatus 600 during operation thereof, according to embodiments of the disclosure. As illustrated in FIG. 12, inside the lollipop-shaped flow path 1912 and the lollipop-shaped indentation 340, heated fluid may then flow to the second cavity S2 of the pumping unit 1900 via the fifth opening 320, as indicated by arrow K.

Figure 13:
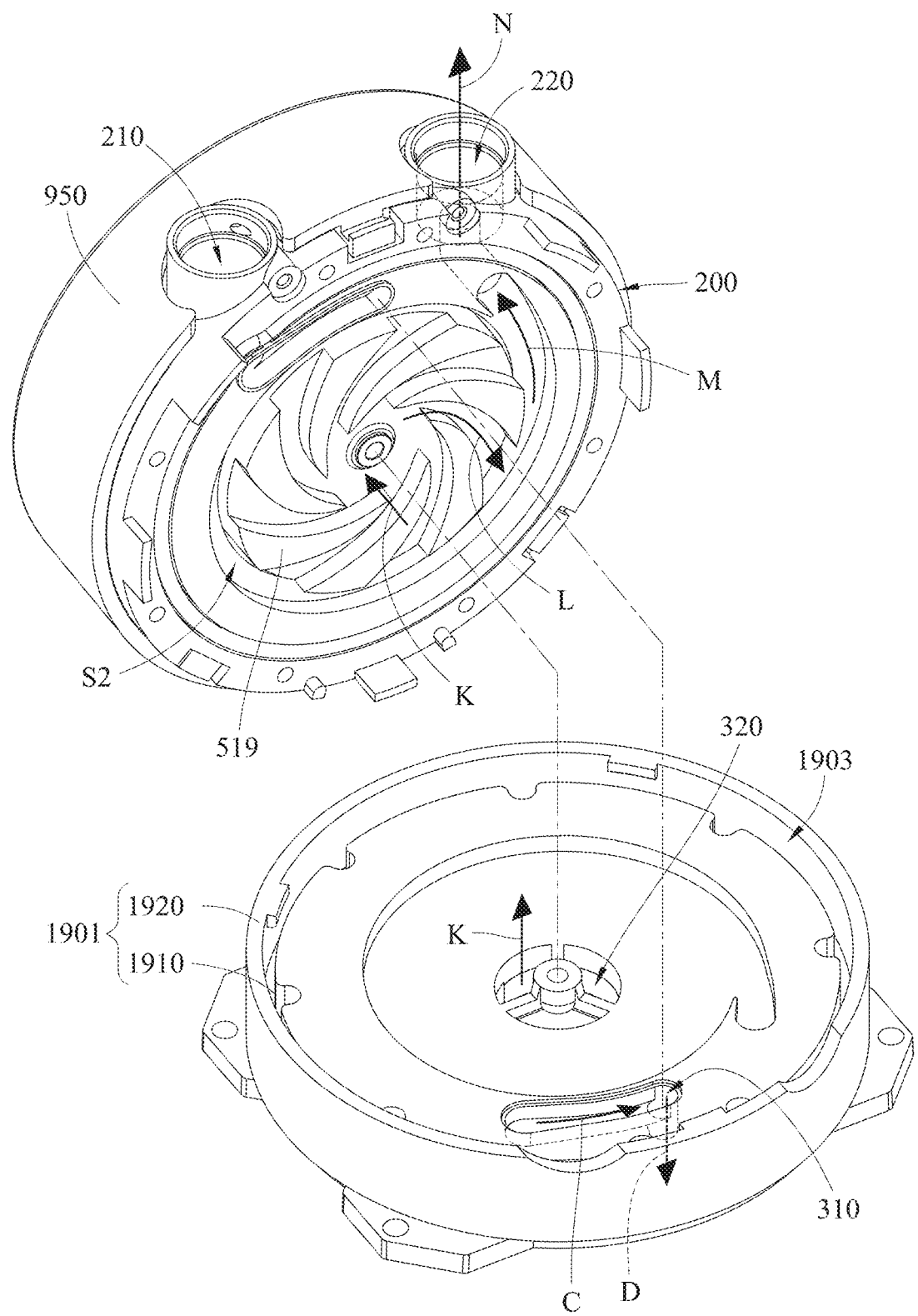
FIG. 13 is a perspective view of the cooling apparatus that illustrates fluid flow in the cooling apparatus during operation thereof, according to embodiments of the disclosure.

FIG. 13 is a perspective view of the cooling apparatus 600 that illustrates fluid flow in the cooling apparatus 600 during operation thereof, according to embodiments of the disclosure. As illustrated in FIG. 13, inside the second cavity S2, the heated fluid contacts the plurality of blades of the rotor portion 519, as indicated by arrow L, and then enters the outlet flow path 260, as indicated by arrow M. Inside the second cavity S2, the heated fluid may then exit the pumping unit 1900 via the outlet 220, as indicated by arrow N. The heated fluid then flows to the external heat dissipating device that cools the fluid using a cooling device, such as a radiator and/or one or more fans. The cooler fluid is then provided to the inlet 210 for recirculation into the heat exchange unit 1600.

Although the base plate 410 illustrated in FIGS. 6B, and 6C is generally oval in shape, the base plate 410 is not limited to having any particular shape, and may be of any desired shape and size, based on, for instance, application, design and/or the number and size of the heat generating sources (e.g., a central processing unit (CPU), a graphic processing unit (GPU), and the like) attached to the base periphery surface 412 of the base plate 410, without departing from the scope of the disclosure.

The embodiments of the cooling apparatus provide efficient and easy reassembly of the pumping units to different heat exchange units (e.g., different shapes or sizes) via the first end opening and the second end opening, and the third opening of the first flow path and the second flow path of the pumping units, respectively, being sized and configured to liquid-tight fit with the first opening and second opening of the heat exchange units.

Fluid that flows between the pumping units and the heat exchange units is limited from leaking out of the cooling apparatus following reassembly. Also, the embodiments of the cooling apparatus provide a less complex pumping unit with fewer assembly parts via the fourth opening and fifth opening being in liquid communication with the first flow path and second flow path, respectively, and the first end opening and the second end opening, and the third opening being in liquid communication with the first flow path and second flow path, respectively, and first opening and second opening, respectively.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the elements that it introduces.

What is claimed is:

1. A cooling apparatus, comprising:
a base plate configured to dissipate heat;
a top plate coupled to the base plate, the top plate and the base plate defining a heat exchange chamber, the top plate includes a first opening and a second opening, the first opening and the second opening positioned above the heat exchange chamber, the first opening and the second opening in fluid communication with the heat exchange chamber;
a pumping unit disposed on the base plate, the pumping unit is over the first opening and the second opening, the pumping unit configured to circulate fluid into and out of the heat exchange chamber, wherein
the pumping unit includes a housing, a body, a rotor cover plate and a motor control circuit, the motor control circuit is disposed on the body, the body is disposed on the rotor cover plate, the body disposed on the rotor cover plate is at least partially installed in the housing, the motor control circuit controlling the cooling apparatus, wherein
the rotor cover plate includes a wishbone shaped indentation and a lollipop shaped indentation, the lollipop-shaped indentation separated from the wishbone-shaped indentation; and
the housing includes a bottom inner surface, the bottom inner surface includes a first end opening, a second end opening, a third opening, and a support structure, the support structure includes a wishbone-shaped flow path and a lollipop-shaped flow path separated from the wishbone-shaped flow path, the first end opening and the second end opening defined at opposite leg ends of a wishbone portion of the wishbone-shaped flow path, the third opening defined at an end of a stick portion of the lollipop-shaped flow path, and
the rotor cover plate is substantially flat and the support structure is substantially flat, the body disposed on the rotor cover plate is coupled to the housing such that the wishbone-shaped indentation and the wishbone-shaped flow path define a first flow path and the lollipop-shaped indentation and the lollipop-shaped flow path define a second flow path separated from the first flow path; and
a casing positioned on the pumping unit, the casing at least partially enclosing the pumping unit,
the pumping unit is coupled to the heat exchange chamber such that the first flow path is in fluid communication with the heat exchange chamber through the first opening via the first end opening and the second end opening and the second flow path is in fluid communication with the heat exchange chamber through the second opening via the third opening.

2. The cooling apparatus of claim 1, wherein
the body includes a stator portion and a rotor portion, the rotor portion includes a plurality of blades disposed on a flat circular surface of the rotor portion,
the rotor cover plate includes a fourth opening and a fifth opening, the fourth opening in fluid communication with the first flow path and the fifth opening in fluid communication with the second flow path,
the pumping unit is coupled to the heat exchange chamber such that the first flow path is in fluid communication with the heat exchange chamber through the first opening via the fourth opening and first end opening and the second end opening and the second flow path is in fluid communication with the heat exchange chamber through the second opening via the fifth opening and the third opening.

3. The cooling apparatus of claim 1, wherein
the heat exchange unit includes a plurality of fins,
the first opening includes a first elongated slot and is defined at a center of the top plate and the second opening includes an ovular shaped opening and is defined at a corner of the top plate, and
the top plate is coupled to the base plate such that the first elongated slot is perpendicular to the plurality of fins.

4. The cooling apparatus of claim 1, wherein
the motor control circuit is substantially flat and includes at least one light source, the motor control circuit controlling the at least one light source to turn on and off, and
light from the at least one light source is at least partially emitted from the cooling apparatus via the cover.

5. The cooling apparatus of claim 1, wherein the body disposed on the rotor cover plate and the housing are coupled together.

6. The cooling apparatus of claim 2, further comprising a fourth sealing element disposed between the body disposed on the rotor cover plate, the fourth sealing element surrounds a transition flow path indentation of the body, a transition flow path of the rotor cover plate, and the fourth opening, and an outlet flow path of the body, a second cavity of the body, a rotor blade receiving portion of the rotor cover plate, and the fifth opening.

7. The cooling apparatus of claim 1, wherein the body and the housing are coupled together.

8. The cooling apparatus of claim 2, further comprising a third sealing element disposed between the rotor cover plate and the housing, the third sealing element surrounds the fourth opening, the first flow path, the first end opening, and the second end opening, and the fifth opening, the second flow path, and the third opening.

9. The cooling apparatus of claim 1, wherein the pumping unit and the base plate are coupled together.

10. The cooling apparatus of claim 1, further comprising a first sealing element disposed between the pumping unit and the top plate, the first sealing element surrounds the first end opening, the second end opening, a bottom housing indentation of the housing, and the first opening, and a second sealing element disposed between the pumping unit and the top plate, the second sealing element surrounds the first end opening, the second end opening, the bottom housing indentation, and the first opening and the third opening and the second opening.

11. A method of operating a cooling apparatus, the method comprising:
receiving fluid into a pumping unit via a corresponding inlet of the pumping unit, the pumping unit coupled to a heat exchange unit, the heat exchange unit includes a base plate and a top plate, and a casing positioned on the pumping unit, the casing at least partially enclosing the pumping unit, wherein
the base plate is configured to dissipate heat,
the top plate is coupled to the base plate, the top plate and the base plate defining a heat exchange chamber, the top plate includes a first opening and a second opening, the first opening and the second opening positioned above the heat exchange chamber, the first opening and the second opening in fluid communication with the heat exchange chamber,
the pumping unit is disposed on heat exchange unit, the pumping unit is over the first opening and the second opening, the pumping unit is configured to circulate fluid into and out of the heat exchange chamber, wherein
the pumping unit includes a housing, a body, a rotor cover plate and a motor control circuit, the motor control circuit is disposed on the body, the body is disposed on the rotor cover plate, the body disposed on the rotor cover plate is at least partially installed in the housing, the motor control circuit controls the cooling apparatus, wherein
the rotor cover plate includes a wishbone shaped indentation and a lollipop shaped indentation, the lollipop-shaped indentation separated from the wishbone-shaped indentation; and
the housing includes a bottom inner surface, the bottom inner surface includes a first end opening, a second end opening, a third opening, and a support structure, the support structure includes a wishbone-shaped flow path and a lollipop-shaped flow path separated from the wishbone-shaped flow path, the first end opening and the second end opening defined at opposite leg ends of a wishbone portion of the wishbone-shaped flow path, the third opening defined at an end of a stick portion of the lollipop-shaped flow path, and
the rotor cover plate is substantially flat and the support structure is substantially flat, the body disposed on the rotor cover plate is coupled to the housing such that the wishbone-shaped indentation and the wishbone-shaped flow path define a first flow path and the lollipop-shaped indentation and the lollipop-shaped flow path define a second flow path separated from the first flow path,
transferring the fluid into the heat exchange chamber via the first flow path, the first end opening, the second end opening, and the first opening;
transferring the fluid into the pumping unit via the second opening, the third opening, and the second flow path; and
outputting the fluid from the pumping unit via a corresponding outlet of the pumping unit.

12. The method of claim 11, wherein
the body includes a stator portion and a rotor portion, the rotor portion includes a plurality of blades disposed on a flat circular surface of the rotor portion, and
the rotor cover plate includes a fourth opening and a fifth opening, the fourth opening in fluid communication with the first flow path and the fifth opening in fluid communication with the second flow path, and
wherein the method further comprises:
transferring the fluid into the heat exchange chamber via the fourth opening, the first flow path, the first end opening, the second end opening, and the first opening;
transferring the fluid into the pumping unit via the second opening, the third opening, the second flow path, and the fifth opening.

13. The method of claim 11, wherein
the heat exchange unit includes a plurality of fins,
the first opening includes a first elongated slot and is defined at a center of the top plate and the second opening includes an ovular shaped opening and is defined at a corner of the top plate, and
the top plate is coupled to the base plate such that the first elongated slot is perpendicular to the plurality of fins.

14. The method of claim 11, wherein
the motor control circuit is substantially flat and includes at least one light source, the motor control circuit controls the at least one light source to turn on and off, and
light from the at least one light source is at least partially emitted from the cooling apparatus via the cover.

15. The method of claim 11, wherein the body disposed on the rotor cover plate and the housing are coupled together by fasteners.

16. The method of claim 12, further comprising a fourth sealing element disposed between the body disposed on the rotor cover plate, the fourth sealing element surrounds a transition flow path indentation of the body, a transition flow path of the rotor cover plate, and the fourth opening, and an outlet flow path of the body, a second cavity of the body, a rotor blade receiving portion of the rotor cover plate, and the fifth opening.

17. The method of claim 11, wherein the body and the housing are coupled together by fasteners.

18. The method of claim 12, further comprising a third sealing element disposed between the rotor cover plate and the housing, the third sealing element surrounds the fourth opening, the first flow path, the first end opening, and the second end opening, and the fifth opening, the second flow path, and the third opening.

19. The method of claim 11, wherein the pumping unit and the base plate are coupled together by fasteners.

20. The method of claim 11, further comprising a first sealing element disposed between the pumping unit and the top plate, the first sealing element surrounds the first end opening, the second end opening, a bottom housing indentation of the housing, and the first opening, and a second sealing element disposed between the pumping unit and the top plate, the second sealing element surrounds the first end opening, the second end opening, the bottom housing indentation, and the first opening and the third opening and the second opening.

* * * * *